United States Patent
Tran et al.

(10) Patent No.: US 11,289,171 B1
(45) Date of Patent: Mar. 29, 2022

(54) MULTI-LEVEL ULTRA-LOW POWER INFERENCE ENGINE ACCELERATOR

(71) Applicant: SanDisk Technologies LLC, Addison, TX (US)

(72) Inventors: Michael Nicolas Albert Tran, San Jose, CA (US); Michael Grobis, Campbell, CA (US)

(73) Assignee: SanDisk Technologies LLC, Addison, TX (US)

( * ) Notice: Subject to any disclaimer, the term of this patent is extended or adjusted under 35 U.S.C. 154(b) by 0 days.

(21) Appl. No.: 17/061,820

(22) Filed: Oct. 2, 2020

(51) Int. Cl.
*G11C 17/16* (2006.01)
*G11C 17/18* (2006.01)
*G06N 3/08* (2006.01)
*G11C 11/54* (2006.01)

(52) U.S. Cl.
CPC .............. *G11C 17/18* (2013.01); *G06N 3/08* (2013.01); *G11C 11/54* (2013.01); *G11C 17/16* (2013.01)

(58) Field of Classification Search
CPC ......... G11C 17/18; G11C 11/54; G11C 17/16; G06N 3/08
USPC .................................................. 365/96, 100
See application file for complete search history.

(56) References Cited

U.S. PATENT DOCUMENTS

| | | | | |
|---|---|---|---|---|
| 5,677,867 A | * | 10/1997 | Hazani | G11C 11/5621 257/E21.682 |
| 6,151,248 A | * | 11/2000 | Harari | G11C 11/5621 257/315 |
| 10,892,279 B1 | * | 1/2021 | Sakotsubo | H01L 27/11582 |
| 2003/0218920 A1 | * | 11/2003 | Harari | H01L 27/115 365/200 |
| 2013/0148404 A1 | * | 6/2013 | Bandyopadhyay | H01L 45/1675 365/103 |
| 2017/0110206 A1 | * | 4/2017 | Ryu | G11C 29/52 |
| 2017/0263328 A1 | * | 9/2017 | Maekawa | H01L 21/84 |
| 2018/0358470 A1 | | 12/2018 | Lee et al. | |
| 2020/0083236 A1 | * | 3/2020 | Wang | H01L 27/11206 |
| 2020/0194048 A1 | * | 6/2020 | Roy | H01L 27/226 |

FOREIGN PATENT DOCUMENTS

| TW | I686803 B | 3/2020 |
|---|---|---|
| TW | 202016803 A | 5/2020 |

OTHER PUBLICATIONS

Chou, Shau-Yu, et al., "A 10nm 32Kb Low-Voltage Logic-Compatible Anti-Fuse One-Time Programmable Memory with Anti-Tampering Sensing Scheme," ISSCC 2017, Session 11, Feb. 2017, 3 pages.

(Continued)

*Primary Examiner* — Michael T Tran
(74) *Attorney, Agent, or Firm* — Vierra Magen Marcus LLP

(57) ABSTRACT

Non-volatile memory structures for performing compute-in-memory inferencing for neural networks are presented. A memory array is formed according to a crosspoint architecture with a memory cell at each crosspoint junction. The multi-levels memory cells (MLCs) are formed of multiple of ultra-thin dielectric layers separated by metallic layers, where programming of the memory cell is done by selectively breaking down one or more of the dielectric layers by selecting the write voltage level. In an alternate set of embodiments, the memory cells are formed as anti-fuses.

20 Claims, 24 Drawing Sheets

(56) References Cited

OTHER PUBLICATIONS

Chen, Yu-Zheng, et al., "Multilevel Anti-Fuse Cells by Progressive Rupturing of the High-k Gate Dielectric i nFinFET Technologies," IEEE Electron Device Letters, vol. 37, No. 9, Sep. 2016, 3 pages.
Hsiao, Woan Yun, et al., "A New High-Density Twin-Gate Isolation One-Time Programmable Memory Cell in Pure 28-nm CMOS Logic Process," IEEE Transactions on Electron Devices, vol. 62, No. 1, Jan. 2015, 7 pages.
Office Action dated Dec. 20, 2021, Taiwan Patent Application No. 110122640.
English Abstract of Taiwan Publication No. 202016803 published May 1, 2020.
English Abstract of Taiwan Publication No. 1686803 published Mar. 1, 2020.

\* cited by examiner

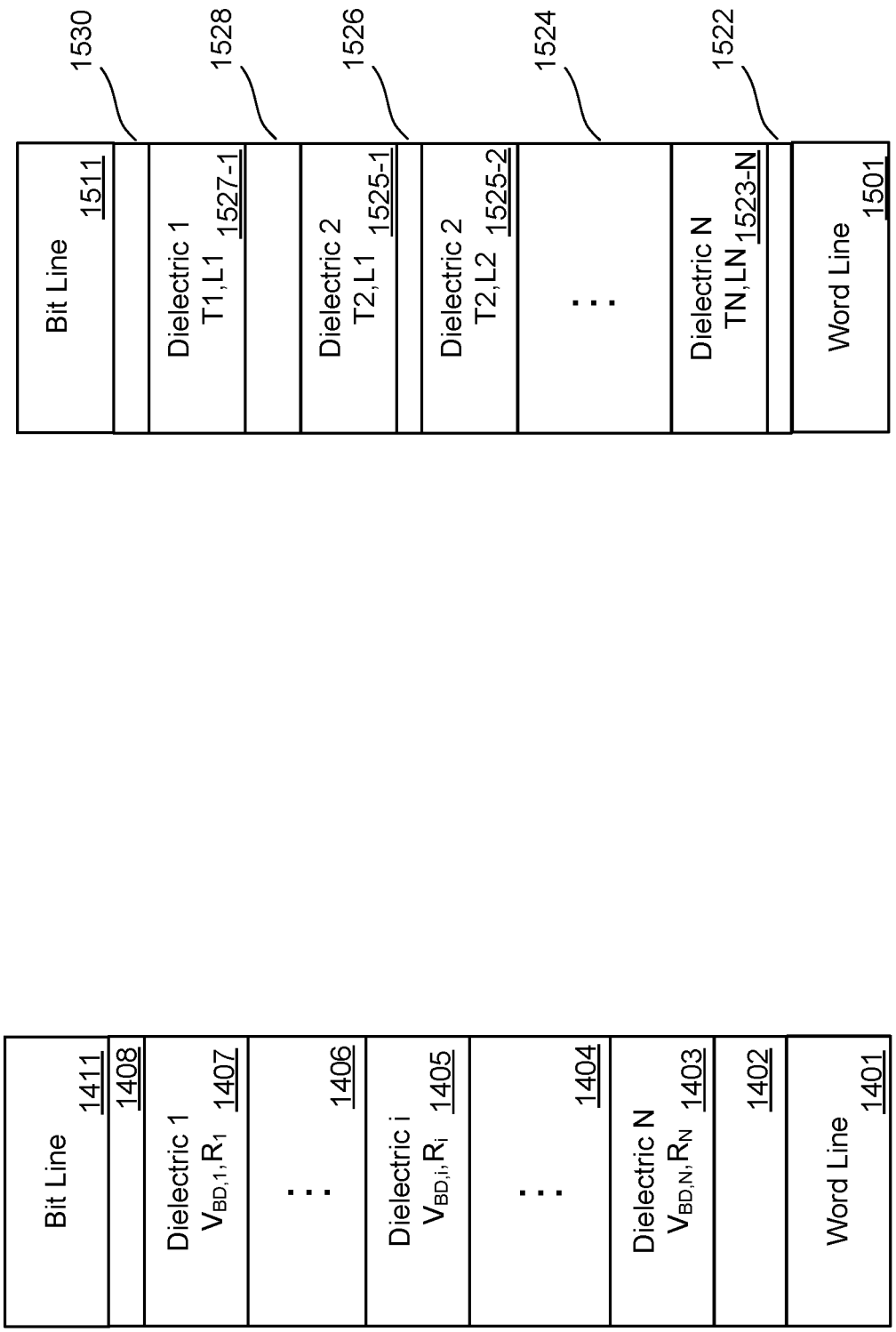

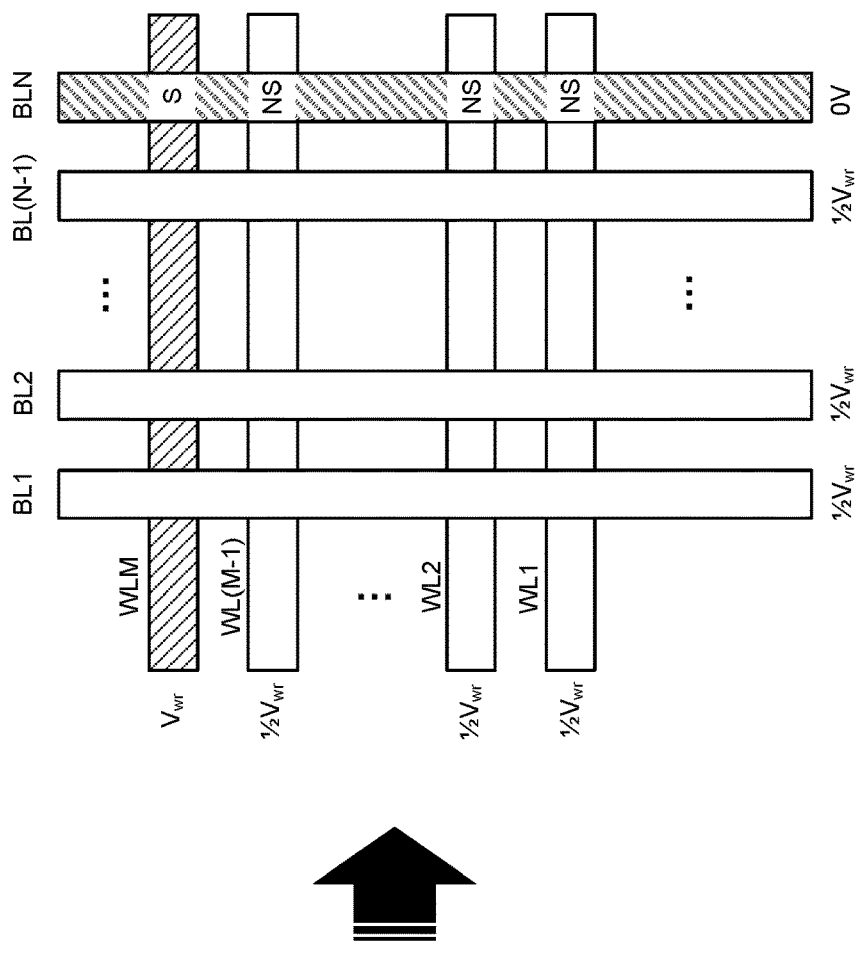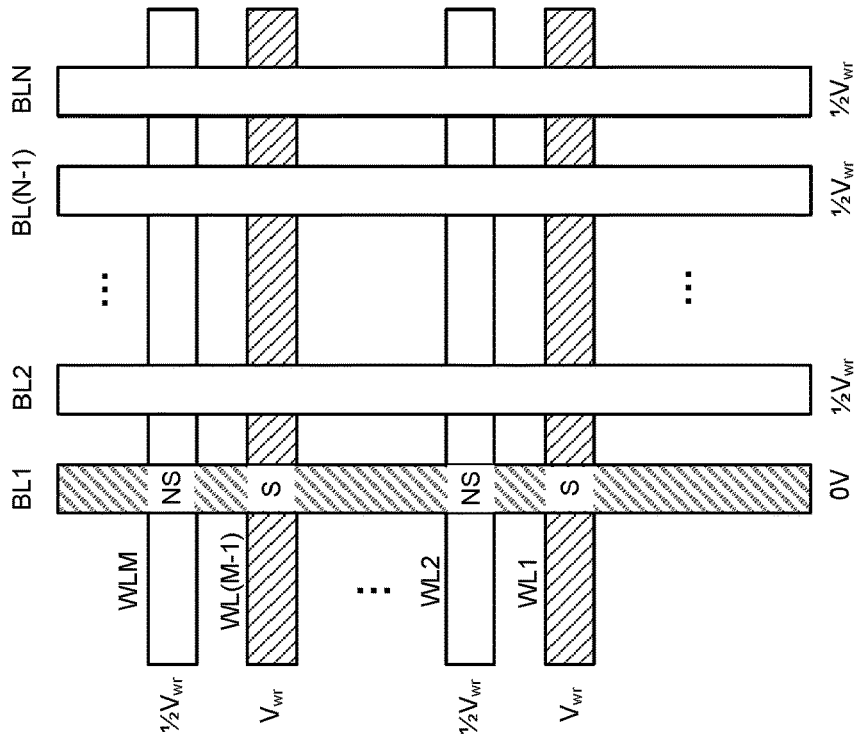
Figure 17

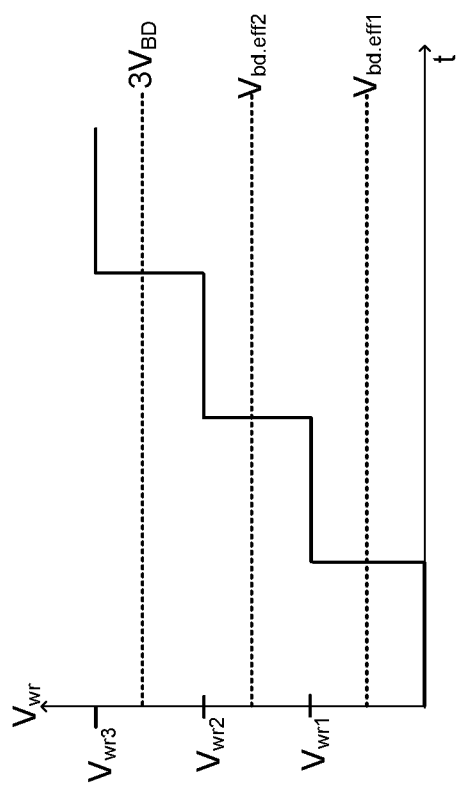
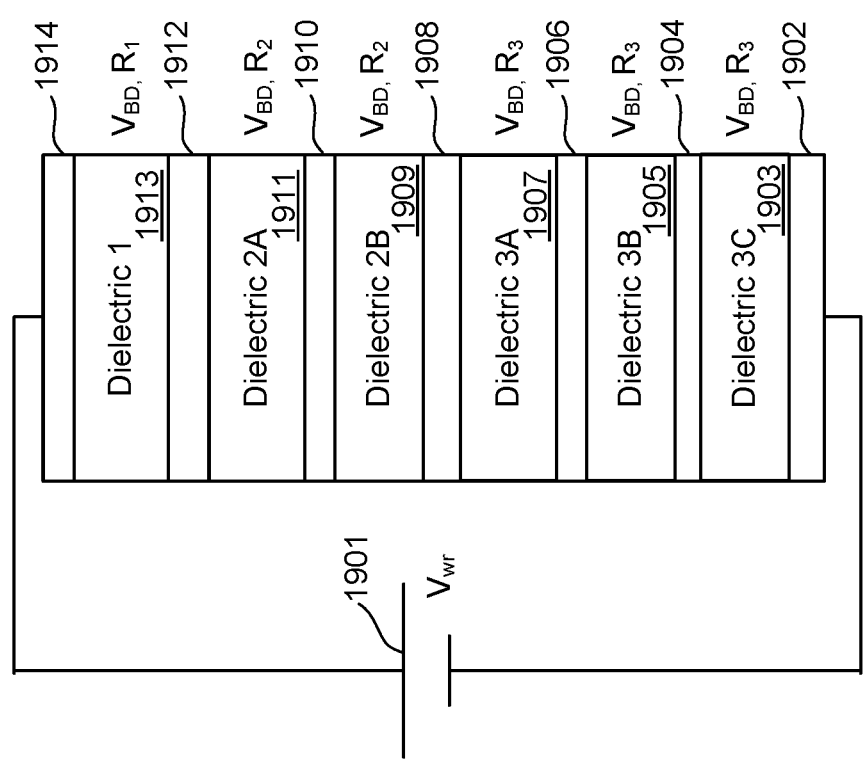
Figure 19B
Figure 19A

MULTI-LEVEL ULTRA-LOW POWER INFERENCE ENGINE ACCELERATOR

BACKGROUND

Artificial neural networks are finding increasing usage in artificial intelligence and machine learning applications. In an artificial neural network, a set of inputs is propagated through one or more intermediate, or hidden, layers to generate an output. The layers connecting the input to the output are connected by sets of weights that are generated in a training or learning phase by determining a set of a mathematical manipulations to turn the input into the output, moving through the layers calculating the probability of each output. Once the weights are established, they can be used in the inference phase to determine the output from a set of inputs. Although such neural networks can provide highly accurate results, they are extremely computationally intensive, and the data transfers involved in reading the weights connecting the different layers out of memory and transferring these weights into the processing units of a processing unit can be quite intensive.

BRIEF DESCRIPTION OF THE DRAWING

Like-numbered elements refer to common components in the different figures.

FIG. 14 is a schematic representation of a first embodiment of a memory cell design that be used in a multi-level ultra-low power inference engine.

FIG. 15 is a schematic representation of another set of embodiments of a memory cell design using grouped dielectric layers that can be used in a multi-level ultra-low power inference engine.

FIG. 17 is a schematic representation of an embodiment of a sequence for writing a crosspoint memory with memory cells formed of multiple dielectric layers.

FIGS. 19A and 19B illustrate the writing mechanism by dielectric breakdown in the example of a three tiered layers.

DETAILED DESCRIPTION

When a neural network performs an inference or training operation, large numbers of computations each involving large amounts of data are performed, particularly in the case of Deep Neural Networks, or DNNs, that involve large numbers of numbers of computational layers, such as convolutional and fully connected layers, through which the inputs are propagated. To avoid the movement of large amounts of data in and out of the memory device, the weights of the layers for a neural network are stored in the non-volatile memory arrays of the memory device and the computations for each of the layers are performed on the device. To further improve performance, both in terms of increased speed and reduced power consumption, the following presents embodiments for multi-levels memory cells (MLCs) that can be used to perform in-array vector multiplications between the weights and inputs during inference operations for a neural network and that do require special on-chip programming. The vector multiplication device for an inference engine includes a crosspoint array with a memory cell at each crosspoint junction. The control circuitry is configured to supply independent input voltages to each wire in one plane of wires (i.e., word lines) and reading current on each wire in the other wire plane (i.e., bit lines). The vector multiplication is performed in the crosspoint memory array as a multiplication of the input voltages by the matrix weights encoded by the memory cells. The memory cells in the crosspoint array can be individually programmed solely using input voltages. In a first set of embodiments, the multi-level memory cells are formed of multiple of ultra-thin dielectric layers separated by metallic layers, where programming of a memory cell is done by selectively breaking down one or more of the dielectric layers by selecting the write voltage level. In a second set of embodiments, the memory cells are formed as anti-fuses.

Figure 1:
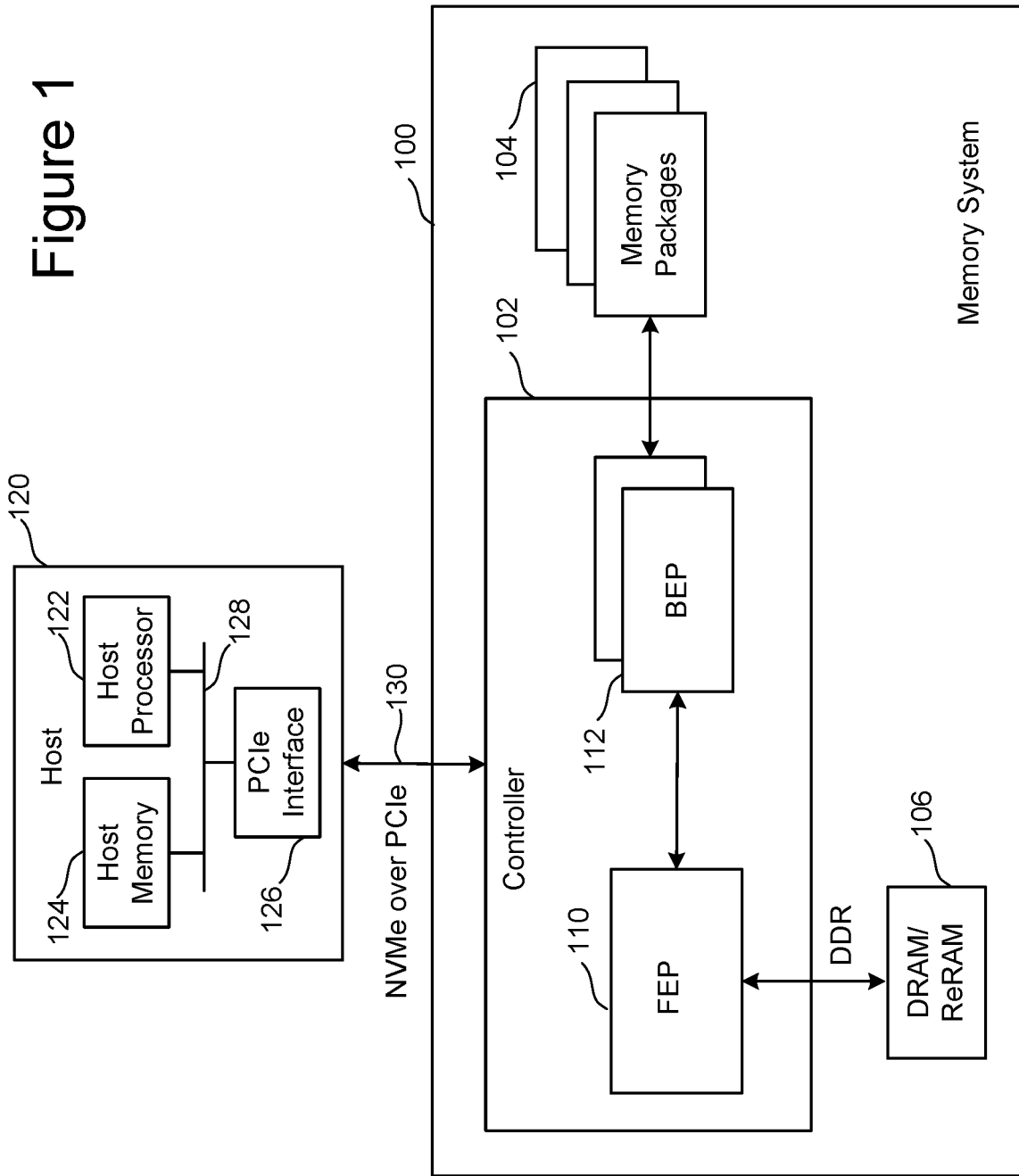
FIG. 1 is a block diagram of one embodiment of a memory system connected to a host.

FIG. 1 is a block diagram of one embodiment of a memory system 100 connected to a host 120. Memory system 100 can implement the technology proposed herein, where the neural network inputs or other data are received from the host 120. Depending on the embodiment, the inputs can be received from the host 120 and then provided to the memory packages 104 for inferencing on the weights previously programmed into the memory arrays of the memory packages 104. Many different types of memory systems can be used with the technology proposed herein. Example memory systems include solid state drives ("SSDs"), memory cards and embedded memory devices; however, other types of memory systems can also be used.

Memory system 100 of FIG. 1 comprises a controller 102, non-volatile memory 104 for storing data, and local memory (e.g., DRAM/ReRAM) 106. Controller 102 comprises a Front End Processor (FEP) circuit 110 and one or more Back End Processor (BEP) circuits 112. In one embodiment FEP circuit 110 is implemented on an ASIC. In one embodiment, each BEP circuit 112 is implemented on a separate ASIC. In other embodiments, a unified controller ASIC can combine both the front end and back end functions. The ASICs for each of the BEP circuits 112 and the FEP circuit 110 are implemented on the same semiconductor such that the controller 102 is manufactured as a System on a Chip ("SoC"). FEP circuit 110 and BEP circuit 112 both include their own processors. In one embodiment, FEP circuit 110 and BEP circuit 112 work as a master slave configuration where the FEP circuit 110 is the master and each BEP circuit 112 is a slave. For example, FEP circuit 110 implements a Flash Translation Layer (FTL) or Media Management Layer (MML) that performs memory management (e.g., garbage collection, wear leveling, etc.), logical to physical address translation, communication with the host, management of DRAM (local volatile memory) and management of the overall operation of the SSD (or other non-volatile storage system). The BEP circuit 112 manages memory operations in the memory packages/die at the request of FEP circuit 110. For example, the BEP circuit 112 can carry out the read, erase, and programming processes. Additionally, the BEP circuit 112 can perform buffer management, set specific voltage levels required by the FEP circuit 110, perform error correction (ECC), control the Toggle Mode interfaces to the memory packages, etc. In one embodiment, each BEP circuit 112 is responsible for its own set of memory packages.

In one embodiment, non-volatile memory 104 comprises a plurality of memory packages. Each memory package includes one or more memory die. Therefore, controller 102 is connected to one or more non-volatile memory die. In one embodiment, each memory die in the memory packages 104 utilize NAND flash memory (including two dimensional NAND flash memory and/or three dimensional NAND flash memory). In other embodiments, the memory package can include other types of memory, such as storage class memory (SCM) based on resistive random access memory (such as ReRAM, MRAM, FeRAM or RRAM) or a phase change memory (PCM).

Controller 102 communicates with host 120 via an interface 130 that implements a protocol, like for example NVM Express (NVMe) over PCI Express (PCIe). For working with memory system 100, host 120 includes a host processor 122, host memory 124, and a PCIe interface 126 connected along bus 128. Host memory 124 is the host's physical memory, and can be DRAM, SRAM, non-volatile memory, or another type of storage. Host 120 is external to and separate from memory system 100. In one embodiment, memory system 100 is embedded in host 120.

Figure 2:
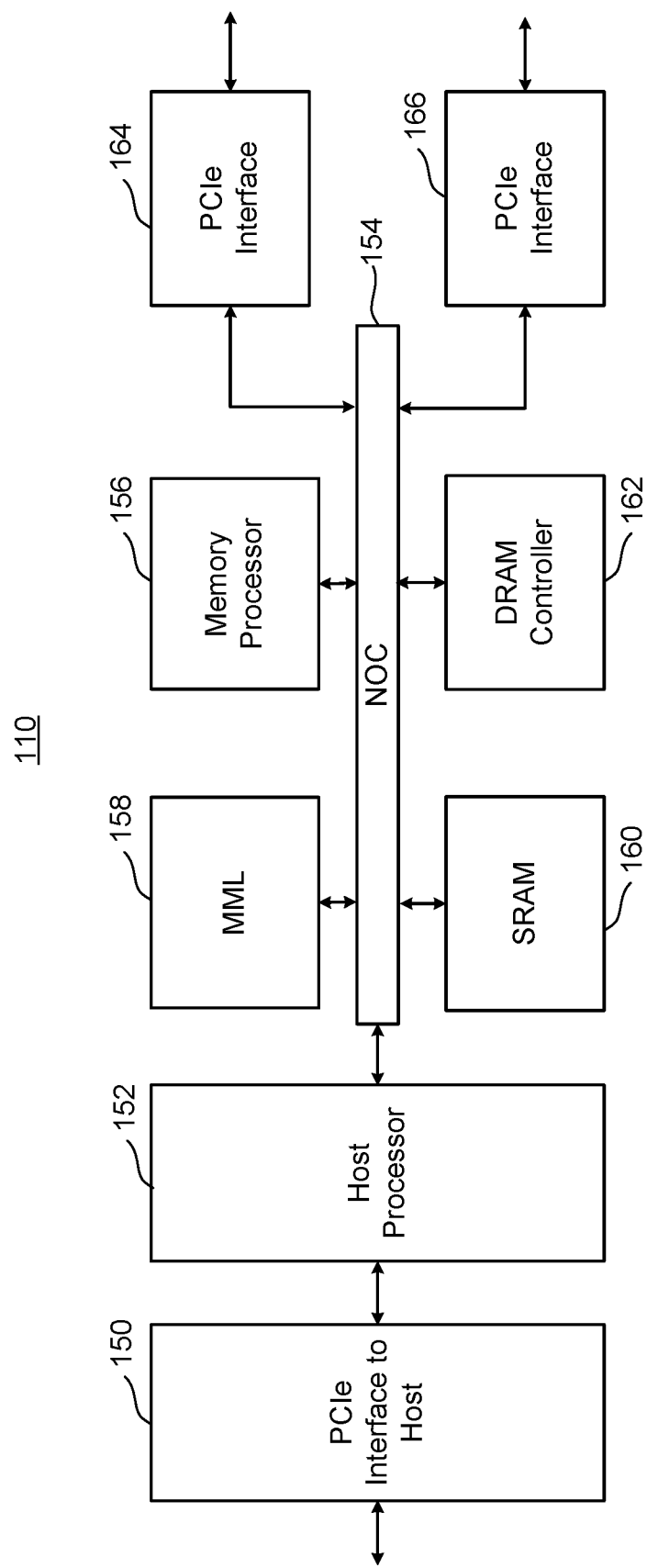
FIG. 2 is a block diagram of one embodiment of a Front End Processor Circuit. In some embodiments, the Front End Processor Circuit is part of a Controller.

FIG. 2 is a block diagram of one embodiment of FEP circuit 110. FIG. 2 shows a PCIe interface 150 to communicate with host 120 and a host processor 152 in communication with that PCIe interface. The host processor 152 can be any type of processor known in the art that is suitable for the implementation. Host processor 152 is in communication with a network-on-chip (NOC) 154. A NOC is a communication subsystem on an integrated circuit, typically between cores in a SoC. NOCs can span synchronous and asynchronous clock domains or use unclocked asynchronous logic. NOC technology applies networking theory and methods to on-chip communications and brings notable improvements over conventional bus and crossbar interconnections. NOC improves the scalability of SoCs and the power efficiency of complex SoCs compared to other designs. The wires and the links of the NOC are shared by many signals. A high level of parallelism is achieved because all links in the NOC can operate simultaneously on different data packets. Therefore, as the complexity of integrated subsystems keep growing, a NOC provides enhanced performance (such as throughput) and scalability in comparison with previous communication architectures (e.g., dedicated point-to-point signal wires, shared buses, or segmented buses with bridges). Connected to and in communication with NOC 154 is the memory processor 156, SRAM 160 and a DRAM controller 162. The DRAM controller 162 is used to operate and communicate with the DRAM (e.g., DRAM 106). SRAM 160 is local RAM memory used by memory processor 156. Memory processor 156 is used to run the FEP circuit and perform the various memory operations. Also, in communication with the NOC are two PCIe Interfaces 164 and 166. In the embodiment of FIG. 2, the SSD controller will include two BEP circuits 112; therefore, there are two PCIe Interfaces 164/166. Each PCIe Interface communicates with one of the BEP circuits 112. In other embodiments, there can be more or less than two BEP circuits 112; therefore, there can be more than two PCIe Interfaces.

FEP circuit 110 can also include a Flash Translation Layer (FTL) or, more generally, a Media Management Layer (MML) 158 that performs memory management (e.g., garbage collection, wear leveling, load balancing, etc.), logical to physical address translation, communication with the host, management of DRAM (local volatile memory) and management of the overall operation of the SSD or other non-volatile storage system. The media management layer MML 158 may be integrated as part of the memory management that may handle memory errors and interfacing with the host. In particular, MML may be a module in the FEP circuit 110 and may be responsible for the internals of memory management. In particular, the MML 158 may include an algorithm in the memory device firmware which translates writes from the host into writes to the memory structure (e.g., 326 of FIG. 5 below) of a die. The MML 158 may be needed because: 1) the memory may have limited endurance; 2) the memory structure may only be written in multiples of pages; and/or 3) the memory structure may not be written unless it is erased as a block. The MML 158 understands these potential limitations of the memory structure which may not be visible to the host. Accordingly, the MML 158 attempts to translate the writes from host into writes into the memory structure.

Figure 3:
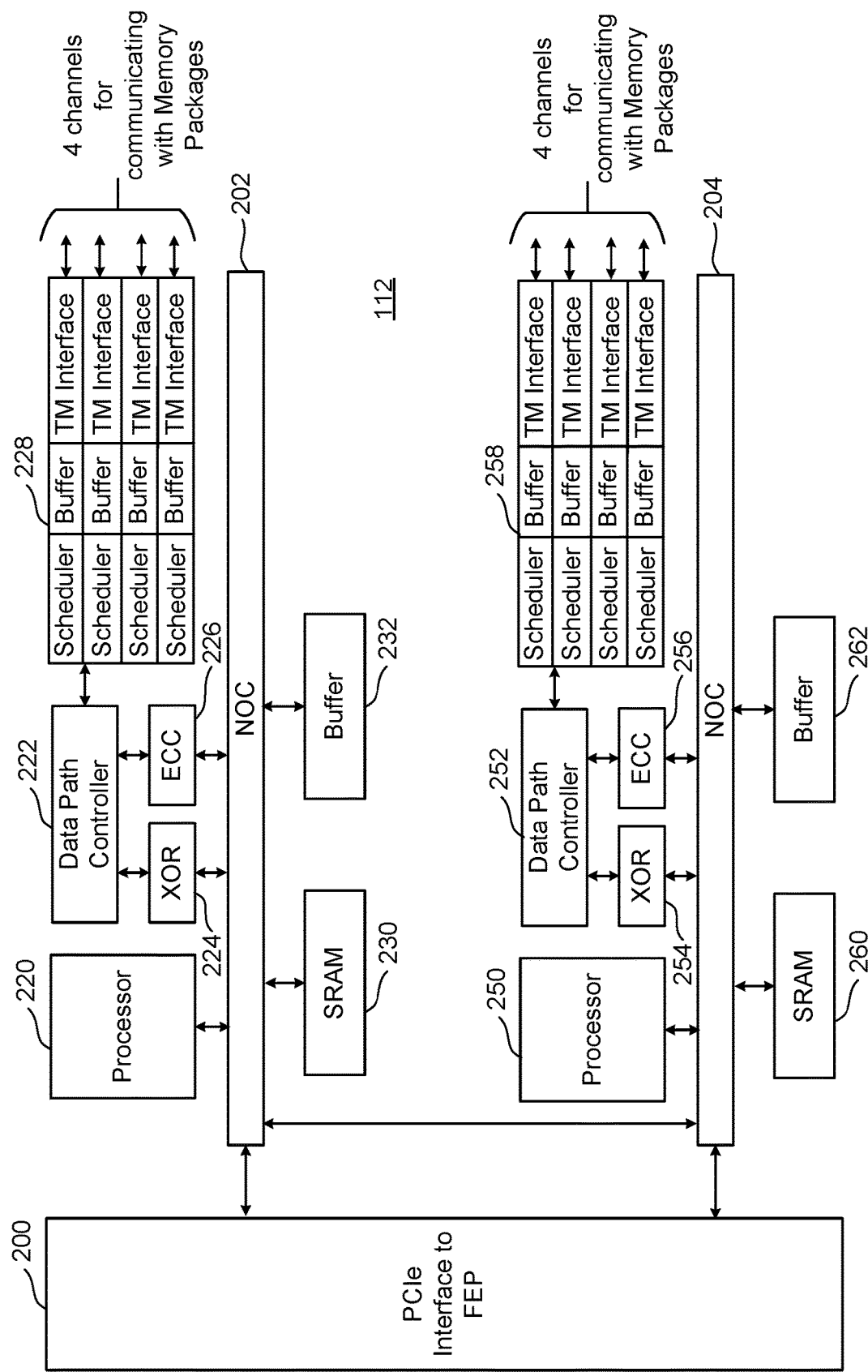
FIG. 3 is a block diagram of one embodiment of a Back End Processor Circuit. In some embodiments, the Back End Processor Circuit is part of a Controller.

FIG. 3 is a block diagram of one embodiment of the BEP circuit 112. FIG. 3 shows a PCIe Interface 200 for communicating with the FEP circuit 110 (e.g., communicating with one of PCIe Interfaces 164 and 166 of FIG. 2). PCIe Interface 200 is in communication with two NOCs 202 and 204. In one embodiment the two NOCs can be combined into one large NOC. Each NOC (202/204) is connected to SRAM (230/260), a buffer (232/262), processor (220/250), and a data path controller (222/252) via an XOR engine (224/254) and an ECC engine (226/256). The ECC engines 226/256 are used to perform error correction, as known in the art. The XOR engines 224/254 are used to XOR the data so that data can be combined and stored in a manner that can be recovered in case there is a programming error. Data path controller 222 is connected to an interface module for communicating via four channels with memory packages. Thus, the top NOC 202 is associated with an interface 228 for four channels for communicating with memory packages and the bottom NOC 204 is associated with an interface 258 for four additional channels for communicating with memory packages. Each interface 228/258 includes four Toggle Mode interfaces (TM Interface), four buffers and four schedulers. There is one scheduler, buffer, and TM Interface for each of the channels. The processor can be any standard processor known in the art. The data path controllers 222/252 can be a processor, FPGA, microprocessor, or other type of controller. The XOR engines 224/254 and ECC engines 226/256 are dedicated hardware circuits, known as hardware accelerators. In other embodiments, the XOR engines 224/254 and ECC engines 226/256 can be implemented in software. The scheduler, buffer, and TM Interfaces are hardware circuits.

Figure 4:
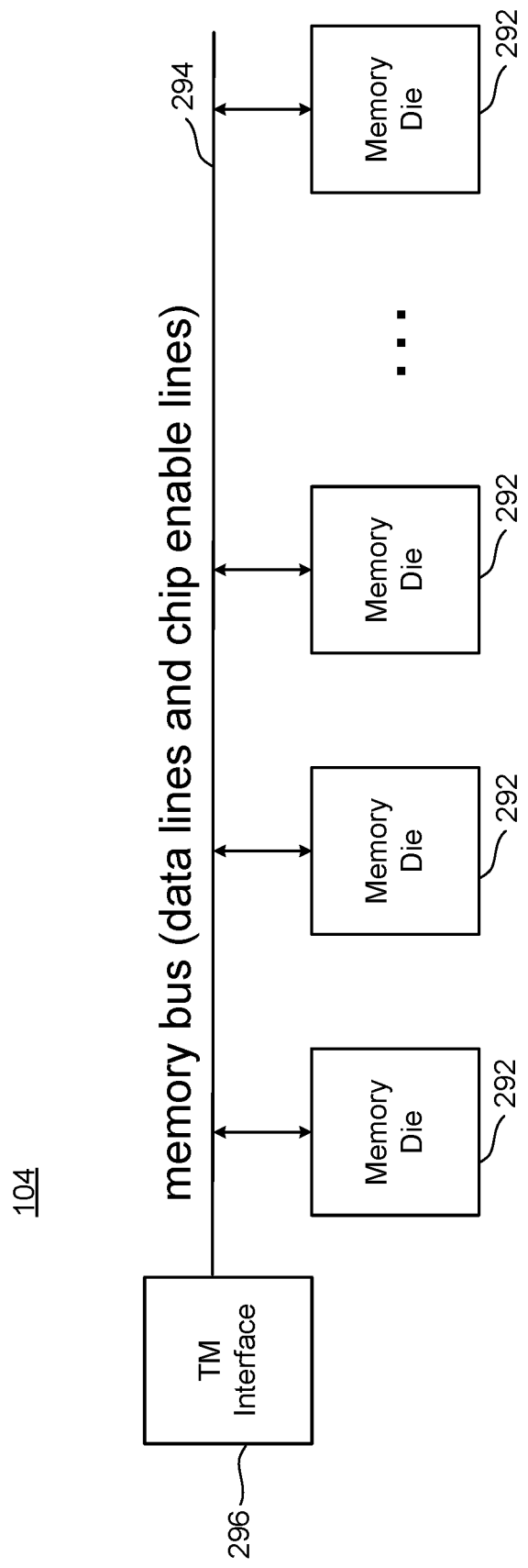
FIG. 4 is a block diagram of one embodiment of a memory package.

FIG. 4 is a block diagram of one embodiment of a memory package 104 that includes a plurality of memory die 292 connected to a memory bus (data lines and chip enable lines) 294. The memory bus 294 connects to a Toggle Mode Interface 296 for communicating with the TM Interface of a BEP circuit 112 (see e.g., FIG. 3). In some embodiments, the memory package can include a small controller connected to the memory bus and the TM Interface. The memory package can have one or more memory die. In one embodiment, each memory package includes eight or 16 memory die; however, other numbers of memory die can also be implemented. The technology described herein is not limited to any particular number of memory die.

Figure 5:
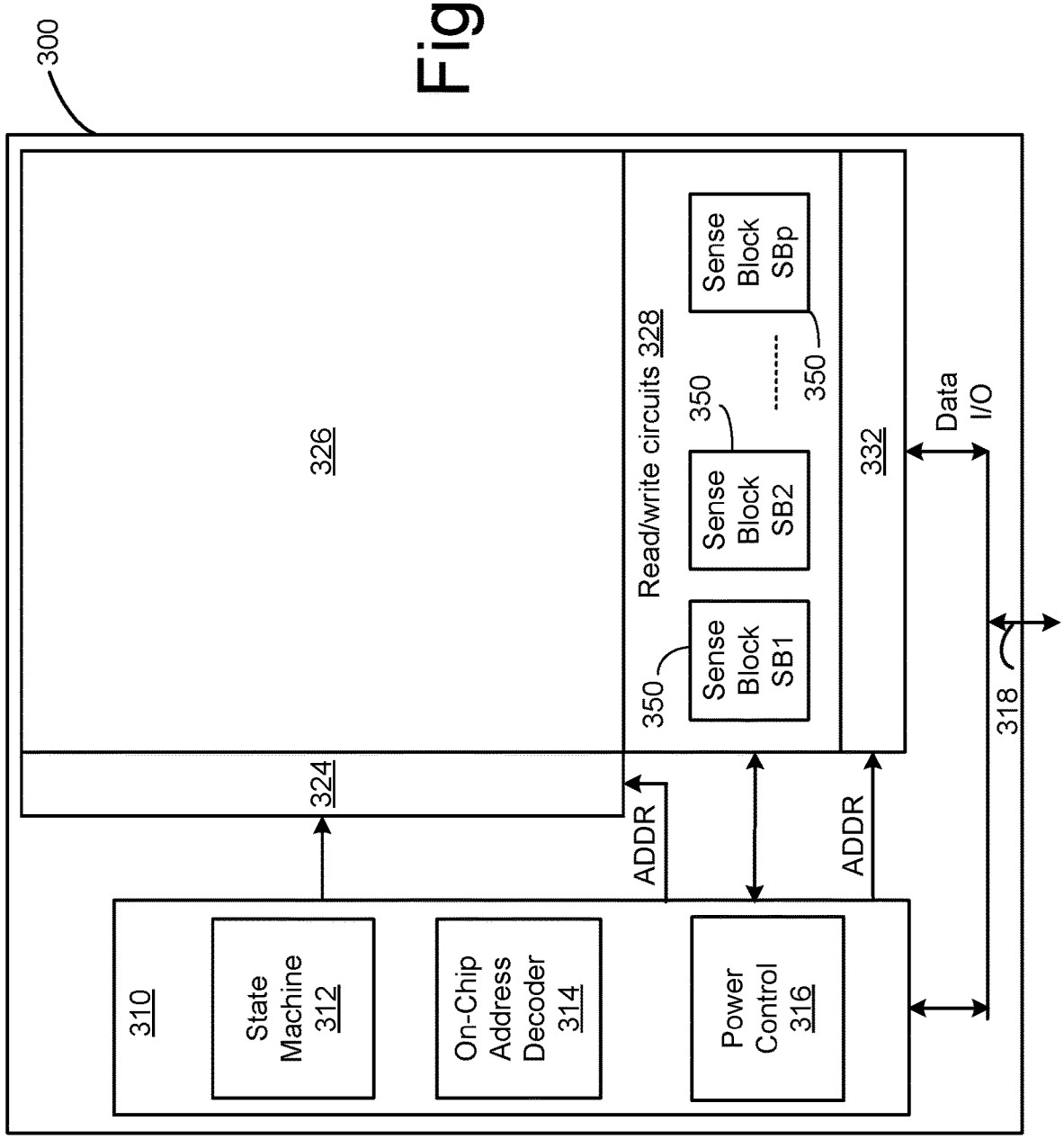
FIG. 5 is a block diagram of one embodiment of a memory die.

FIG. 5 is a functional block diagram of one embodiment of a memory die 300. The components depicted in FIG. 5 are electrical circuits. In one embodiment, each memory die 300 includes a memory structure 326, control circuitry 310, and read/write circuits 328. Memory structure 326 is addressable by word lines via a row decoder 324 and by bit lines via a column decoder 332. The read/write circuits 328 include multiple sense blocks 350 including SB1, SB2, . . . , SBp (sensing circuitry) and allow a page of memory cells to be read or programmed in parallel. Commands and data are transferred between the controller and the memory die 300 via lines 318. In one embodiment, memory die 300 includes a set of input and/or output (I/O) pins that connect to lines 318.

Control circuitry 310 cooperates with the read/write circuits 328 to perform memory operations (e.g., write, read, and others) on memory structure 326, and includes a state machine 312, an on-chip address decoder 314, and a power control circuit 316. State machine 312 provides die-level control of memory operations. In one embodiment, state machine 312 is programmable by software. In other embodiments, state machine 312 does not use software and is completely implemented in hardware (e.g., electrical circuits). In another embodiment, state machine 312 is replaced by a micro-controller.

The on-chip address decoder 314 provides an address interface between addresses used by controller 102 to the hardware address used by the decoders 324 and 332. Power control module 316 controls the power and voltages supplied to the word lines and bit lines during memory operations. Power control module 316 may include charge pumps for creating voltages. The sense blocks include bit line drivers.

For purposes of this document, the phrase "one or more control circuits" can include a controller, a state machine, a micro-controller and/or control circuitry 310, or other analogous circuits that are used to control non-volatile memory.

In one embodiment, memory structure 326 comprises a three dimensional memory array of non-volatile memory cells in which multiple memory levels are formed above a single substrate, such as a wafer. The memory structure may comprise any type of non-volatile memory that are monolithically formed in one or more physical levels of memory cells having an active area disposed above a silicon (or other type of) substrate. In one example, the non-volatile memory cells comprise vertical NAND strings with charge-trapping material such as described, for example, in U.S. Pat. No. 9,721,662, incorporated herein by reference in its entirety.

In another embodiment, memory structure 326 comprises a two dimensional memory array of non-volatile memory cells. In one example, the non-volatile memory cells are NAND flash memory cells utilizing floating gates such as described, for example, in U.S. Pat. No. 9,082,502, incorporated herein by reference in its entirety. Other types of memory cells (e.g., NOR-type flash memory) can also be used.

The exact type of memory array architecture or memory cell included in memory structure 326 is not limited to the examples above. Many different types of memory array architectures or memory technologies can be used to form memory structure 326. No particular non-volatile memory technology is required for purposes of the new claimed embodiments proposed herein. Other examples of suitable technologies for memory cells of the memory structure 326 include ReRAM memories (resistive random access memories), magnetoresistive memory (e.g., MRAM, Spin Transfer Torque MRAM, Spin Orbit Torque MRAM), FeRAM, phase change memory (e.g., PCM), and the like. Examples of suitable technologies for memory cell architectures of the memory structure 326 include two dimensional arrays, three dimensional arrays, cross-point arrays, stacked two dimensional arrays, vertical bit line arrays, and the like.

One example of a ReRAM crosspoint memory includes reversible resistance-switching elements arranged in crosspoint arrays accessed by X lines and Y lines (e.g., word lines and bit lines). In another embodiment, the memory cells may include conductive bridge memory elements. A conductive bridge memory element may also be referred to as a programmable metallization cell. A conductive bridge memory element may be used as a state change element based on the physical relocation of ions within a solid electrolyte. In some cases, a conductive bridge memory element may include two solid metal electrodes, one relatively inert (e.g., tungsten) and the other electrochemically active (e.g., silver or copper), with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature.

Magnetoresistive random access memory (MRAM) stores data by magnetic storage elements. The elements are formed from two ferromagnetic thin films, also known as layers, each of which are ferromagnetic, separated by a thin insulating layer. One of the two layers is a permanent magnet set to a particular polarity; the other layer's magnetization can be changed to match that of an external field to store memory. A memory device is built from a grid of such memory cells. In one embodiment for programming, each memory cell lies between a pair of write lines arranged at right angles to each other, parallel to the cell, one above and one below the cell. When current is passed through them, an induced magnetic field is created.

Phase change memory (PCM) exploits the unique behavior of chalcogenide glass. One embodiment uses a GeTe—Sb2Te3 super lattice to achieve non-thermal phase changes by simply changing the co-ordination state of the Germanium atoms with a laser pulse (or light pulse from another source). Therefore, the doses of programming are laser pulses. The memory cells can be inhibited by blocking the memory cells from receiving the light. In other PCM embodiments, the memory cells are programmed by current pulses. Note that the use of "pulse" in this document does not require a square pulse but includes a (continuous or non-continuous) vibration or burst of sound, current, voltage light, or other wave.

A person of ordinary skill in the art will recognize that the technology described herein is not limited to a single specific memory structure, memory construction or material composition, but covers many relevant memory structures within the spirit and scope of the technology as described herein and as understood by one of ordinary skill in the art.

The elements of FIG. 5 can be grouped into two parts, the memory structure 326 of the memory cells and the peripheral circuitry, including all of the other elements. An important characteristic of a memory circuit is its capacity, which can be increased by increasing the area of the memory die 300 that is given over to the memory structure 326; however, this reduces the area of the memory die 300 available for the peripheral circuitry. This can place quite severe restrictions on these peripheral elements. For example, the need to fit sense amplifier circuits within the available area can be a significant restriction on sense amplifier design architectures. With respect to the on-die control circuitry 310, reduced availability of area can limit the available functionalities that can be implemented on-chip. Consequently, a basic trade-off in the design of a memory die 300 is the amount of area to devote to the memory structure 326 and the amount of area to devote to the peripheral circuitry.

Another area in which the memory structure 326 and the peripheral circuitry are often at odds is in the processing involved in forming these regions, since these regions often involve differing processing technologies and the trade-off in having differing technologies on a single die. For example, when the memory structure 326 is NAND flash, this is an NMOS structure, while the peripheral circuitry is often CMOS based. For example, sense amplifier circuits in the sense blocks 350, charge pumps in the power control block 316, logic elements in the state machine 312, and other peripheral circuitry often employ PMOS devices. Processing operations for manufacturing a CMOS die will differ in many aspects from the processing operations optimized for an NMOS flash NAND memory or other memory cell technologies.

To improve upon these limitations, embodiments described below can separate the elements of FIG. 5 onto separately formed dies that are then bonded together. More specifically, the memory structure 326 can be formed on one die and some or all of the peripheral circuitry elements, including one or more control circuits, can be formed on a separate die. For example, a memory die can be formed of just the memory elements, such as the array of memory cells of flash NAND memory, a PCM memory, a ReRAM memory, or other memory type. Some or all of the peripheral circuitry, even including elements such as decoders and sense amplifiers, can then be moved on to a separate die. This allows each of the memory die to be optimized individually according to its technology. For example, a NAND memory die can be optimized for an NMOS based memory array structure, without worrying about the CMOS elements that have now been moved onto a separate peripheral circuitry die that can be optimized for CMOS processing. This allows more space for the peripheral elements, which can now incorporate additional capabilities that could not be readily incorporated were they restricted to the margins of the same die holding the memory cell array. The two die can then be bonded together in a bonded multi-die memory circuit, with the array on the one die connected to the periphery elements on the other memory circuit. Although the following will focus on a bonded memory circuit of one memory die and one peripheral circuitry die, other embodiments can use more die, such as two memory die and one peripheral circuitry die, for example.

Figure 6A:
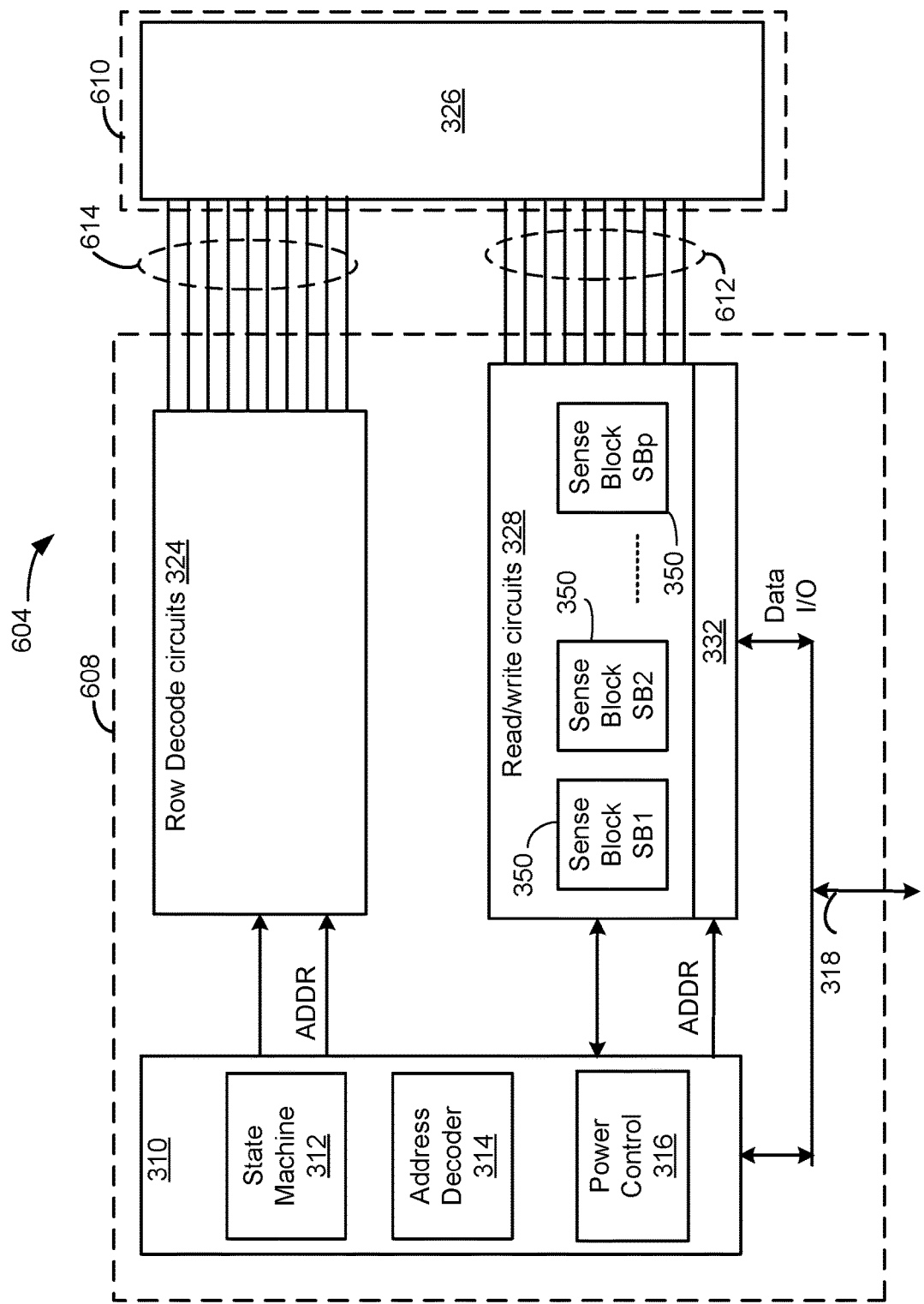
FIGS. 6A and 6B illustrates an example of control circuits coupled to a memory structure through wafer-to-wafer bonding.
Figure 6B:
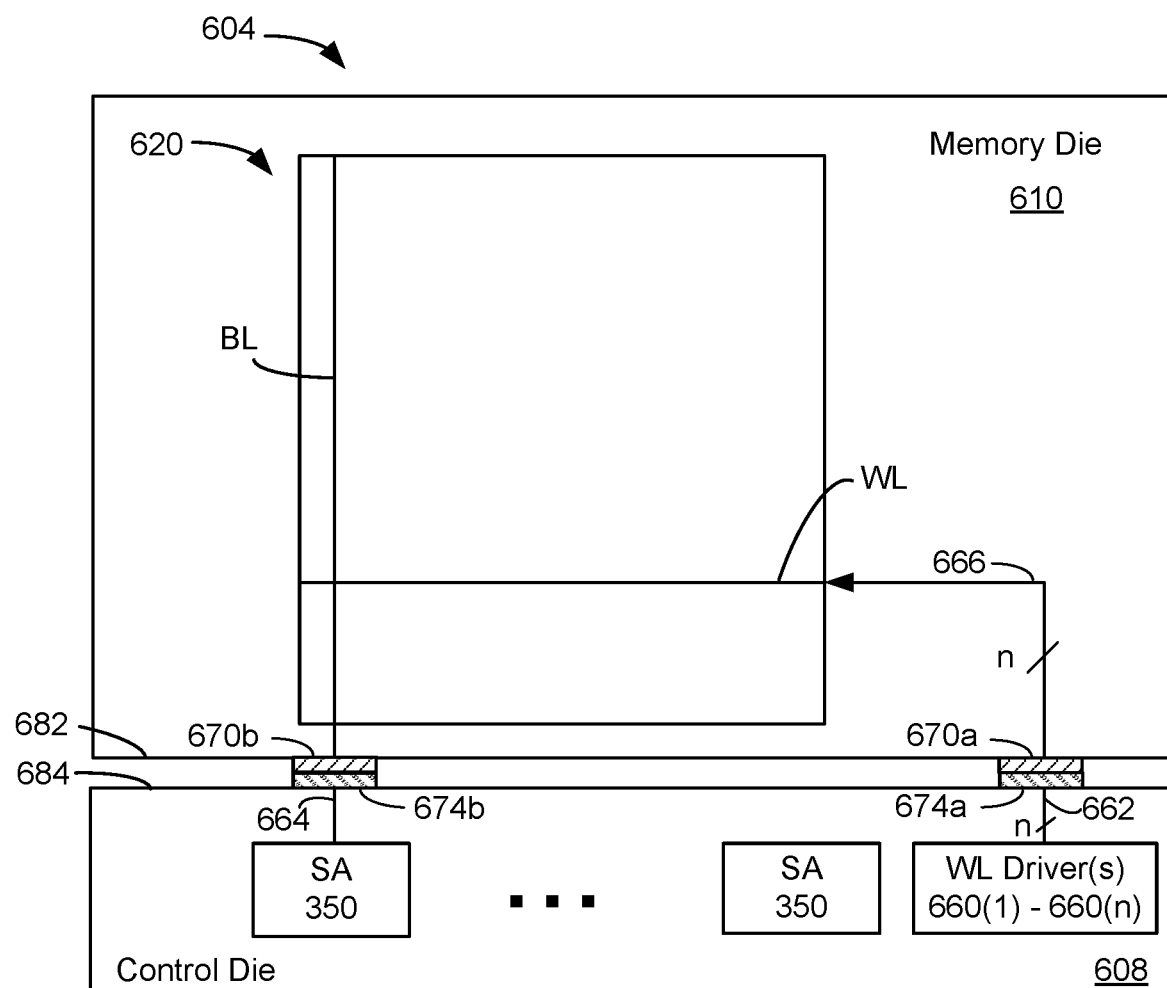

FIGS. 6A and 6B shows an alternative arrangement to that of FIG. 5, which may be implemented using wafer-to-wafer bonding to provide a bonded die pair 604. FIG. 6A shows an example of the peripheral circuitry, including control circuits, formed in a peripheral circuit or control die 608 coupled to memory structure 326 formed in memory die 610. Common components are numbered as in FIG. 5. It can be seen that control circuitry 310, read/write circuits 328, and row decoder 324 (which may be formed by a CMOS process) are located in control die 608 Additional elements, such as functionalities from controller 102 can also be moved into the control die 608. Control circuitry 310, read/write circuits 328, row decoder 324, and column decoder 332 may be formed by a common process (e.g., CMOS process), so that adding elements and functionalities more typically found on a memory controller 102 may require few or no additional process steps (i.e., the same process steps used to fabricate controller 102 may also be used to fabricate control circuitry 310, read/write circuits 328, and row decoder 324). Thus, while moving such circuits from a die such as memory die 300 may reduce the number of steps needed to fabricate such a die, adding such circuits to a die such as control die 608 may not require any additional process steps.

FIG. 6A shows read/write circuits 328 on the control die 608 coupled to memory structure 326 on the memory die 610 through electrical paths 612. For example, electrical paths 612 may provide electrical connection between read/write circuits 328 and bit lines of memory structure 326. Electrical paths may extend from read/write circuits 328 in control die 608 through pads on control die 608 that are bonded to corresponding pads of the memory die 610, which are connected to bit lines of memory structure 326. Each bit line of memory structure 326 may have a corresponding electrical path in electrical paths 612, including a pair of bonded pads, that connects to read/write circuits 328. Similarly, row decoder circuits 324 are coupled to memory structure 326 through electrical paths 614. Each of electrical path 614 may correspond to a word line, dummy word line, or select gate line. Additional electrical paths may also be provided between control die 608 and memory die 610.

FIG. 6B is a block diagram showing more detail on the arrangement of one embodiment of the integrated memory assembly of bonded die pair 604. Memory die 610 contains a plane 620 or array of memory cells. The memory die 610 may have additional planes or arrays. One representative bit line (BL) and representative word line (WL) is depicted for each plane or array 620. There may be thousands or tens of thousands of such bit lines per each plane or array 620. In one embodiment, an array or plane represents a groups of connected memory cells that share a common set of unbroken word lines and unbroken bit lines.

Control die 608 includes a number of sense amplifiers (SA) 350. Each sense amplifier 350 is connected to one bit line or may be connected to multiple bit lines in some embodiments. The sense amplifier contains a bit line driver. Thus, the sense amplifier may provide a voltage to the bit line to which it is connected. The sense amplifier is configured to sense a condition of the bit line. In one embodiment, the sense amplifier is configured to sense a current that flows in the bit line. In one embodiment, the sense amplifier is configured to sense a voltage on the bit line.

The control die 608 includes a number of word line drivers 660(1)-660(n). The word line drivers 660 are configured to provide voltages to word lines. In this example, there are "n" word lines per array or plane memory cells. If the memory operation is a program or read, one word line within the selected block is selected for the memory operation, in one embodiment. If the memory operation is an erase, all of the word lines within the selected block are selected for the erase, in one embodiment. The word line drivers 660 (e.g., part of Power Control 316) provide voltages to the word lines in memory die 610. As discussed above with respect to FIG. 6A, the control die 608 may also include charge pumps, voltage generators, and the like that are not represented in FIG. 6B, which may be used to provide voltages for the word line drivers 660 and/or the bit line drivers.

The memory die 610 has a number of bond pads 670a, 670b on a first major surface 682 of memory die 610. There may be "n" bond pads 670a, to receive voltages from a corresponding "n" word line drivers 660(1)-660(n). There may be one bond pad 670b for each bit line associated with plane 620. The reference numeral 670 will be used to refer in general to bond pads on major surface 682.

In some embodiments, each data bit and each parity bit of a codeword are transferred through a different bond pad pair 670b, 674b. The bits of the codeword may be transferred in parallel over the bond pad pairs 670b, 674b. This provides for a very efficient data transfer relative to, for example, transferring data between the memory controller 102 and the integrated memory assembly 604. For example, the data bus between the memory controller 102 and the integrated memory assembly 604 may, for example, provide for eight, sixteen, or perhaps 32 bits to be transferred in parallel. However, the data bus between the memory controller 102 and the integrated memory assembly 604 is not limited to these examples.

The control die 608 has a number of bond pads 674a, 674b on a first major surface 684 of control die 608. There may be "n" bond pads 674a, to deliver voltages from a corresponding "n" word line drivers 660(1)-660(n) to memory die 610. There may be one bond pad 674b for each bit line associated with plane 620. The reference numeral 674 will be used to refer in general to bond pads on major surface 682. Note that there may be bond pad pairs 670a/674a and bond pad pairs 670b/674b. In some embodiments, bond pads 670 and/or 674 are flip-chip bond pads.

In one embodiment, the pattern of bond pads 670 matches the pattern of bond pads 674. Bond pads 670 are bonded (e.g., flip chip bonded) to bond pads 674. Thus, the bond pads 670, 674 electrically and physically couple the memory die 610 to the control die 608.

Also, the bond pads 670, 674 permit internal signal transfer between the memory die 610 and the control die 608. Thus, the memory die 610 and the control die 608 are bonded together with bond pads. Although FIG. 6A depicts one control die 608 bonded to one memory die 610, in another embodiment one control die 608 is bonded to multiple memory dies 610.

Herein, "internal signal transfer" means signal transfer between the control die 608 and the memory die 610. The internal signal transfer permits the circuitry on the control die 608 to control memory operations in the memory die 610. Therefore, the bond pads 670, 674 may be used for memory operation signal transfer. Herein, "memory operation signal transfer" refers to any signals that pertain to a memory operation in a memory die 610. A memory operation signal transfer could include, but is not limited to, providing a voltage, providing a current, receiving a voltage, receiving a current, sensing a voltage, and/or sensing a current.

The bond pads 670, 674 may be formed for example of copper, aluminum, and alloys thereof. There may be a liner between the bond pads 670, 674 and the major surfaces (682, 684). The liner may be formed for example of a titanium/titanium nitride stack. The bond pads 670, 674 and liner may be applied by vapor deposition and/or plating techniques. The bond pads and liners together may have a thickness of 720 nm, though this thickness may be larger or smaller in further embodiments.

Metal interconnects and/or vias may be used to electrically connect various elements in the dies to the bond pads 670, 674. Several conductive pathways, which may be implemented with metal interconnects and/or vias are depicted. For example, a sense amplifier 350 may be electrically connected to bond pad 674b by pathway 664. Relative to FIG. 6A, the electrical paths 612 can correspond to pathway 664, bond pads 674b, and bond pads 670b. There may be thousands of such sense amplifiers, pathways, and bond pads. Note that the BL does not necessarily make direct connection to bond pad 670b. The word line drivers 660 may be electrically connected to bond pads 674a by pathways 662. Relative to FIG. 6A, the electrical paths 614 can correspond to the pathway 662, the bond pads 674a, and bond pads 670a. Note that pathways 662 may comprise a separate conductive pathway for each word line driver 660(1)-660(n). Likewise, a there may be a separate bond pad 674a for each word line driver 660(1)-660(n). The word lines in block 2 of the memory die 610 may be electrically connected to bond pads 670a by pathways 664. In FIG. 6B, there are "n" pathways 664, for a corresponding "n" word lines in a block. There may be separate pair of bond pads 670a, 674a for each pathway 664.

Relative to FIG. 5, the on-die control circuits of FIG. 6A can also include addition functionalities within its logic elements, both more general capabilities than are typically found in the memory controller 102 and some CPU capabilities, but also application specific features. For example, these activation functions can include addition and threshold determination operations used in the accumulation portion of Multiple and ACcumulation (MAC) operations, but more advanced operations such as sigmoid or tanh functions.

In the following, state machine 312 and/or controller 102 (or equivalently functioned circuits), in combination with all or a subset of the other circuits depicted on the control die 608 in FIG. 6A and similar elements in FIG. 5, can be considered part of the one or more control circuits that perform the functions described herein. The control circuits can include hardware only or a combination of hardware and software (including firmware). For example, a controller programmed by firmware to perform the functions described herein is one example of a control circuit. A control circuit can include a processor, FGA, ASIC, integrated circuit, or other type of circuit.

Turning now to types of data that can be stored in non-volatile memory devices, a particular example of the type of data of interest in the following discussion is the weights used is in artificial neural networks, such as convolutional neural networks or CNNs. The name "convolutional neural network" indicates that the network employs a mathematical operation called convolution, that is a specialized kind of linear operation. Convolutional networks are neural networks that use convolution in place of general matrix multiplication in at least one of their layers. A CNN is formed of an input and an output layer, with a number of intermediate hidden layers. The hidden layers of a CNN are typically a series of convolutional layers that "convolve" with a multiplication or other dot product.

Each neuron in a neural network computes an output value by applying a specific function to the input values coming from the receptive field in the previous layer. The function that is applied to the input values is determined by a vector of weights and a bias. Learning, in a neural network, progresses by making iterative adjustments to these biases and weights. The vector of weights and the bias are called filters and represent particular features of the input (e.g., a particular shape). A distinguishing feature of CNNs is that many neurons can share the same filter.

Figure 7:
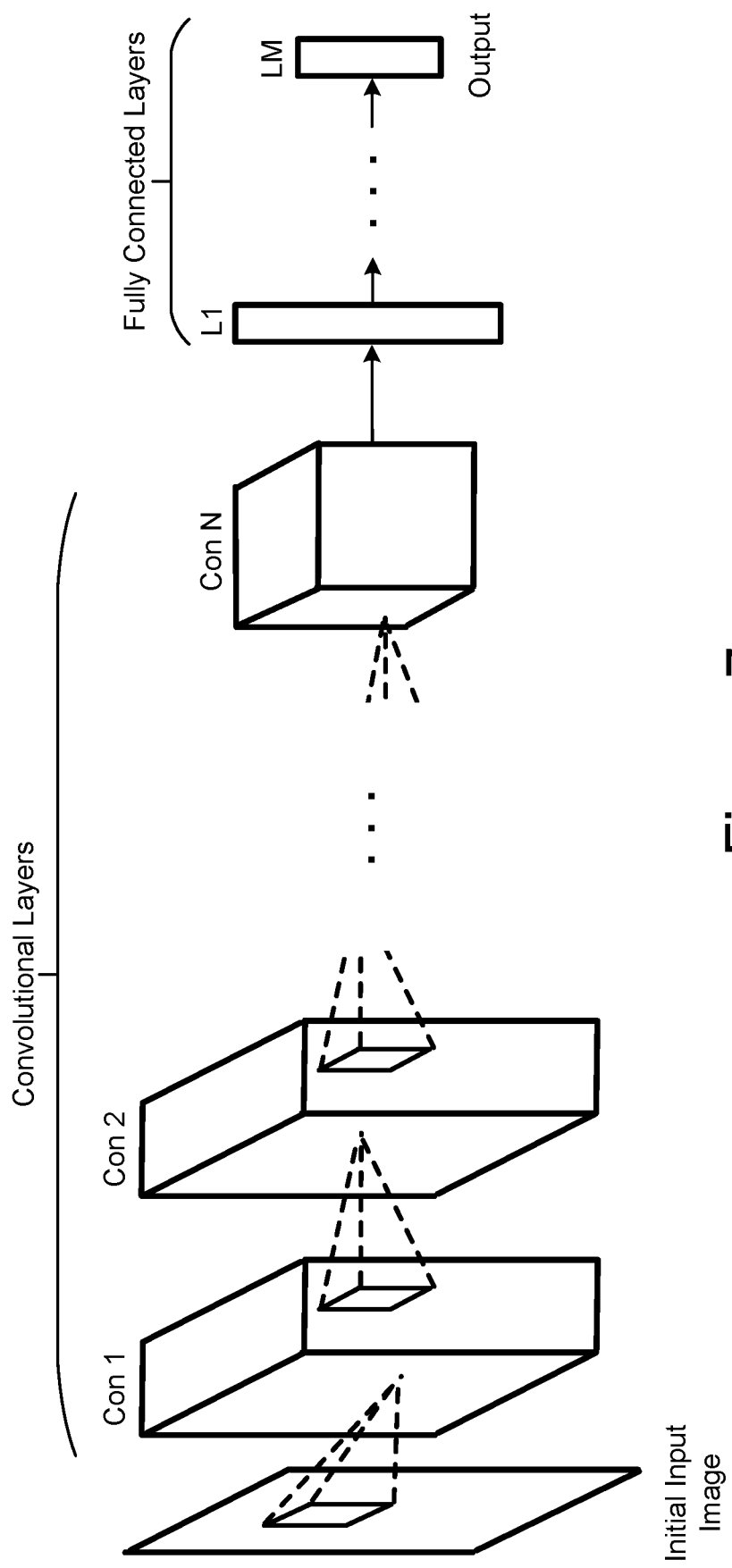
FIG. 7 illustrates a simple example of a convolutional neural network (CNN).

FIG. 7 is a schematic representation of an example of a CNN. FIG. 7 illustrates an initial input image of an array of pixel values, followed by a number of convolutional layers that are in turn followed by a number of fully connected layers, the last of which provides the output. Each neuron in the first convolutional layer (Con 1) takes as input data from an n×n pixel sub-region of the input image. The neuron's learned weights, which are collectively referred to as its convolution filter, determine the neuron's single-valued output in response to the input. In the convolutional layers, a neuron's filter is applied to the input image by sliding the input region along the image's x and y dimensions to generate the values of the convolutional layer. In practice, the equivalent convolution is normally implemented by statically identical copies of the neuron to different input regions. The process is repeated through each of the convolutional layers (Con1 to Con N) using each layer's learned weights, after which it is propagated through the fully connected layers (L1 to LM) using their learned weights.

Figure 8:
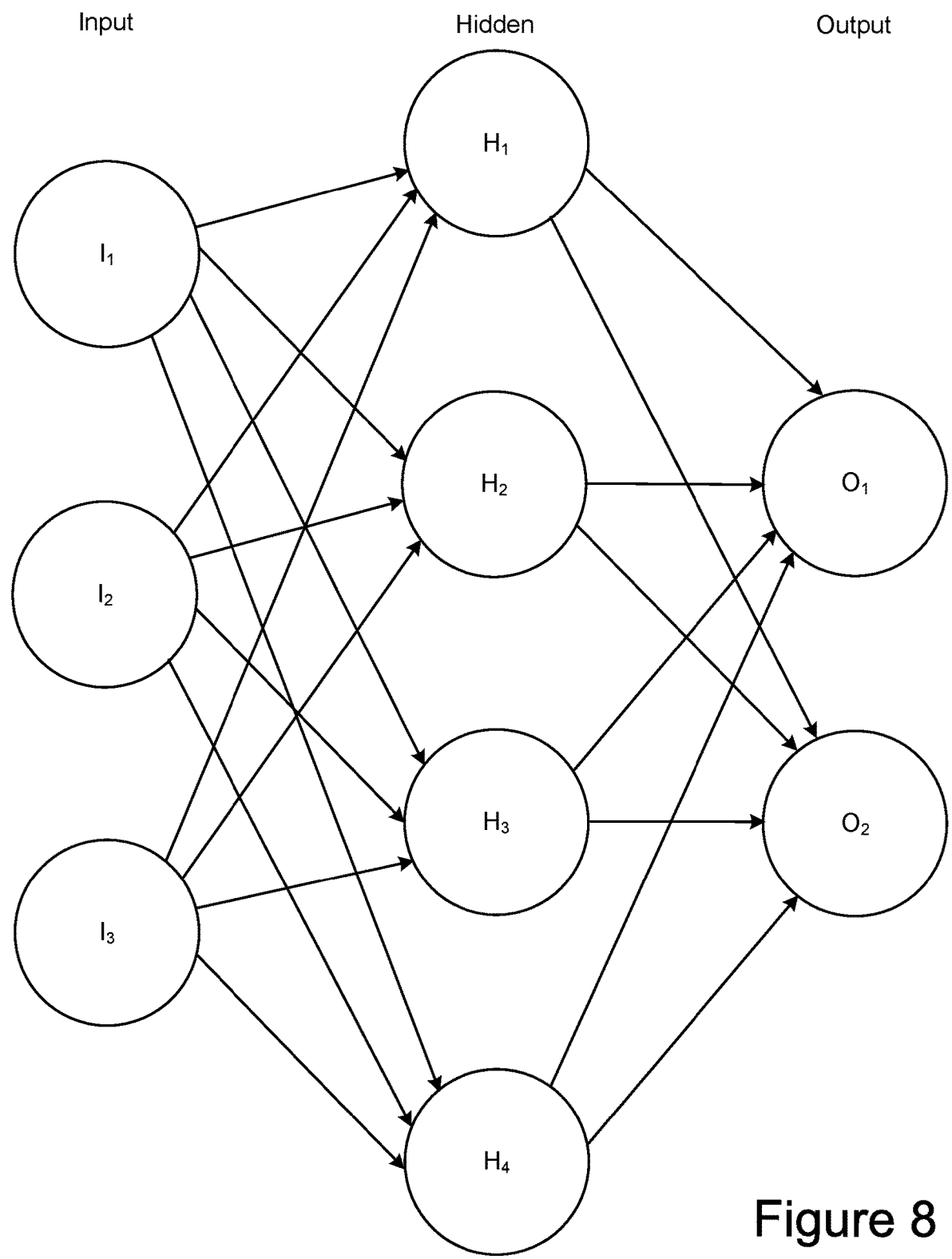
FIG. 8 illustrates a simple example of fully connected layers in an artificial neural network.

FIG. 8 represents several fully connected layers of a neural network in more detail. In FIG. 8 the shown three layers of the artificial neural network are represented as an interconnected group of nodes or artificial neurons, represented by the circles, and a set of connections from the output of one artificial neuron to the input of another. The example shows three input nodes ($I_1$, $I_2$, $I_3$) and two output nodes ($O_1$, $O_2$), with an intermediate layer of four hidden or intermediate nodes ($H_1$, $H_2$, $H_3$, $H_4$). The nodes, or artificial neurons/synapses, of the artificial neural network are implemented by logic elements of a host or other processing system as a mathematical function that receives one or more inputs and sums them to produce an output. Usually each input is separately weighted and the sum is passed through the node's mathematical function to provide the node's output.

In common artificial neural network implementations, the signal at a connection between nodes (artificial neurons/synapses) is a real number, and the output of each artificial neuron is computed by some non-linear function of the sum of its inputs. Nodes and their connections typically have a weight that adjusts as a learning process proceeds. The weight increases or decreases the strength of the signal at a connection. Nodes may have a threshold such that the signal is only sent if the aggregate signal crosses that threshold. Typically, the nodes are aggregated into layers. Different layers may perform different kinds of transformations on their inputs. Signals travel from the first layer (the input layer), to the last layer (the output layer), possibly after traversing the layers multiple times. Although FIG. 7 shows only a single intermediate or hidden layer, a complex deep neural network (DNN) can have many such intermediate layers.

A supervised artificial neural network is "trained" by supplying inputs and then checking and correcting the outputs. For example, a neural network that is trained to recognize dog breeds will process a set of images and calculate the probability that the dog in an image is a certain breed. A user can review the results and select which probabilities the network should display (above a certain threshold, etc.) and return the proposed label. Each mathematical manipulation as such is considered a layer, and complex neural networks have many layers. Due to the depth provided by a large number of intermediate or hidden layers, neural networks can model complex non-linear relationships as they are trained.

Figure 9B:
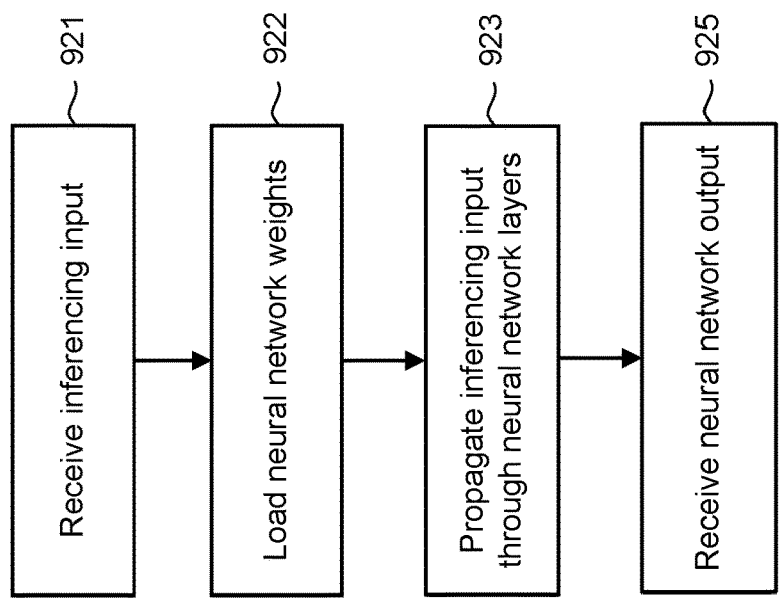
FIG. 9B is a flowchart describing one embodiment of a process for inference using a neural network.
Figure 9A:
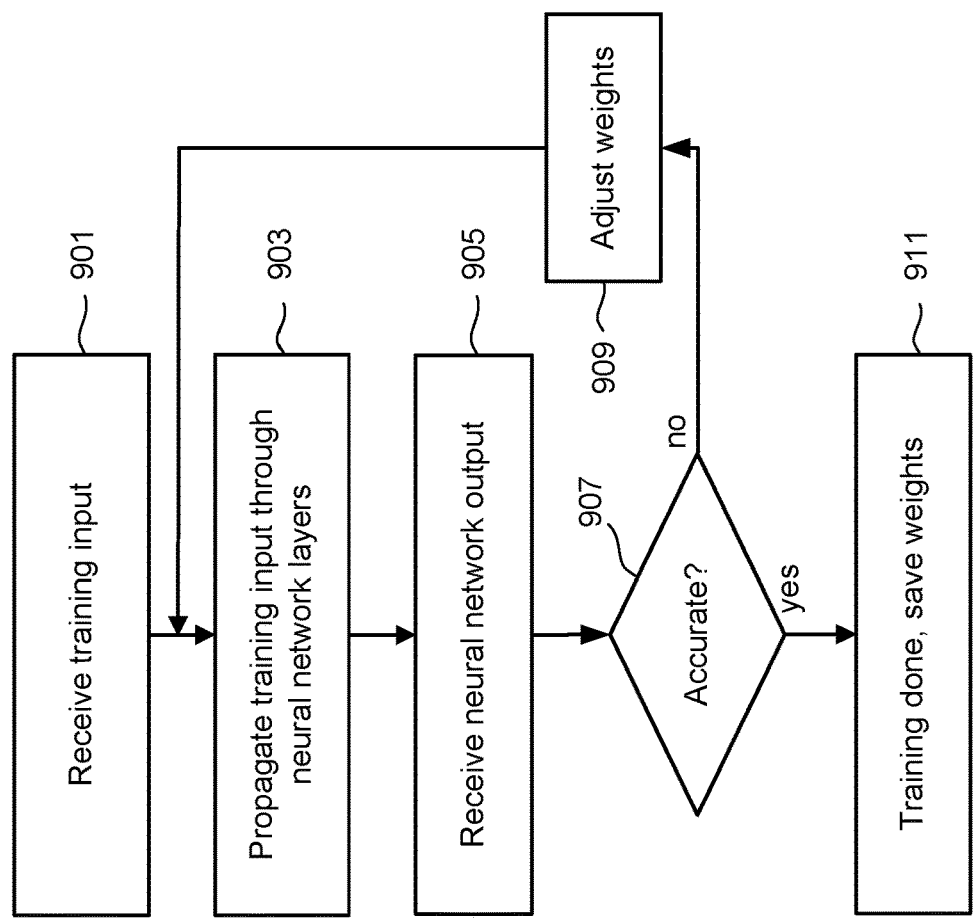
FIG. 9A is a flowchart describing one embodiment of a process for training a neural network to generate a set of weights.

FIG. 9A is a flowchart describing one embodiment of a process for training a neural network to generate a set of weights. The training process is often performed in the cloud, allowing additional or more powerful processing to be accessed. At step 901, the input, such as a set of images, is received (e.g., the image input in FIG. 7). At step 903 the input is propagated through the layers connecting the input to the next layer (e.g., CON1 in FIG. 7) using the current filter, or set of weights. The neural network's output is then received at the next layer (e.g., CON2 in FIG. 7) in step 905, so that the values received as output from one layer serve as the input to the next layer. The inputs from the first layer are propagated in this way through all of the intermediate or hidden layers until they reach the output. In the dog breed example of the preceding paragraph, the input would be the image data of a number of dogs, and the intermediate layers use the current weight values to calculate the probability that the dog in an image is a certain breed, with the proposed dog breed label returned at step 905. A user can then review the results at step 907 to select which probabilities the neural network should return and decide whether the current set of weights supply a sufficiently accurate labelling and, if so, the training is complete (step 911). If the result is not sufficiently accurate, the neural network adjusts the weights at step 909 based on the probabilities the user selected, followed by looping back to step 903 to run the input data again with the adjusted weights. Once the neural network's set of weights have been determined, they can be used to "inference," which is the process of using the determined weights to generate an output result from data input into the neural network. Once the weights are determined at step 911, they can then be stored in non-volatile memory for later use, where the storage of these weights in non-volatile memory is discussed in further detail below.

FIG. 9B is a flowchart describing a process for the inference phase of supervised learning using a neural network to predict the "meaning" of the input data using an estimated accuracy. Depending on the case, the neural network may be inferenced both in the cloud and by an edge device's (e.g., smart phone, automobile process, hardware accelerator) processor. At step 921, the input is received, such as the image of a dog in the example used above. If the previously determined weights are not present in the device running the neural network application, they are loaded at step 922. For example, on a host processor executing the neural network, the weights could be read out of an SSD in which they are stored and loaded into RAM on the host device. At step 923, the input data is then propagated through the neural network's layers. Step 923 will be similar to step 903 of FIG. 9B, but now using the weights established at the end of the training process at step 911. After propagating the input through the intermediate layers, the output is then provided at step 925.

Figure 10:
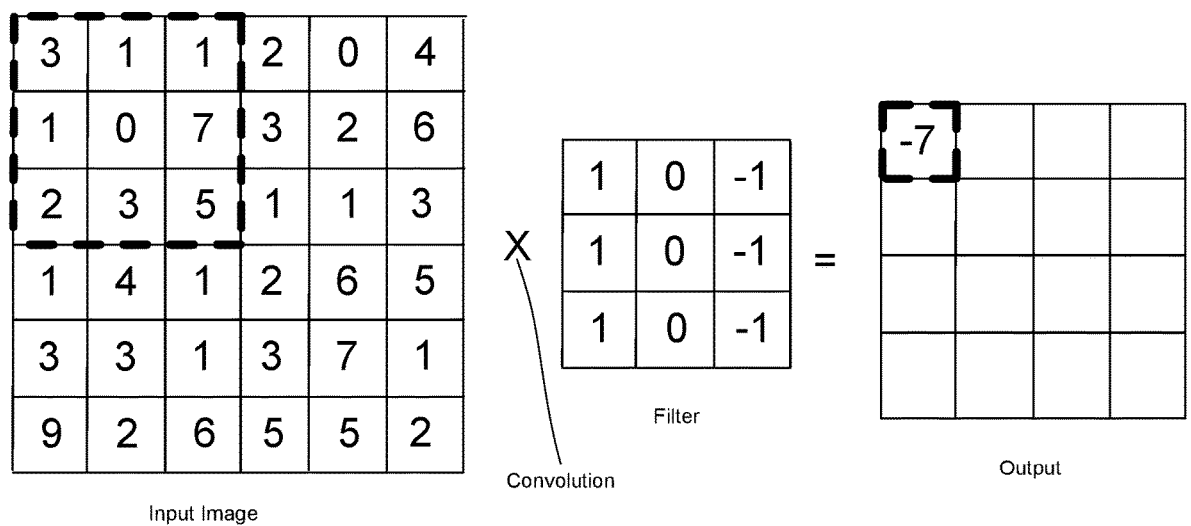
FIG. 10 is a schematic representation of a convolution operation in a convolutional neural network.

FIG. 10 is a schematic representation of a convolution operation between an input image and filter, or set of weights. In this example, the input image is a 6×6 array of pixel values and the filter is a 3×3 array of weights. The convolution operation is performed by a matrix multiplication of the 3×3 filter with 3×3 blocks of the input image. For example, the multiplication of the upper-left most 3×3 block of the image with the filter results in the top left value of the output matrix. The filter can then be slid across by one pixel on the image to generate the next entry of the output, and so on to generate a top row of 4 elements for the output. By repeating this by sliding the filter down a pixel at a time, the 4×4 output matrix is generated. Similar operations are performed for each of the layers. In a real CNN, the size of the data sets and the number of convolutions performed mean that extremely large numbers of such operations are performed involving very large amounts of data.

Figure 11:
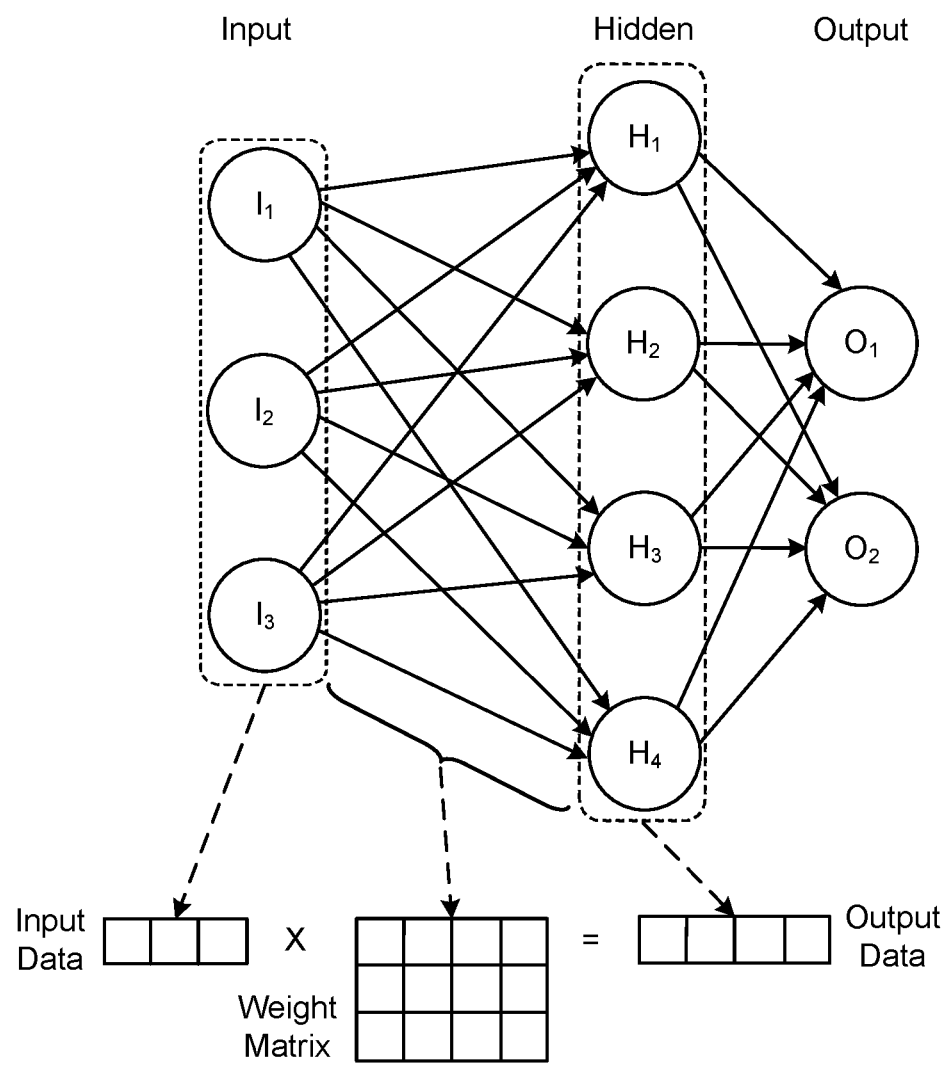
FIG. 11 is a schematic representation of the use of matrix multiplication in a fully connected layer of a neural network.

FIG. 11 is a schematic representation of the use of matrix multiplication in a fully connected layer of a neural network. Matrix multiplication, or MatMul, is a commonly used approach in both the training and inference phases for neural networks and is used in kernel methods for machine learning. FIG. 11 at the top is similar to FIG. 8, where only a single hidden layer is shown between the input layer and the output layer. The input data is represented as a vector of a length corresponding to the number of input nodes. The weights are represented in a weight matrix, where the number of columns corresponds to the number of intermediate nodes in the hidden layer and the number of rows corresponds to the number of input nodes. The output is determined by a matrix multiplication of the input vector and the weight matrix, where each element of the output vector is a dot product of the multiple component vector of the input data with a column of the weight matrix.

A common technique for executing the matrix multiplications is by use of a multiplier-accumulator (MAC, or MAC unit). However, this has a number of issues. Referring back to FIG. 9B, the inference phase loads the neural network weights at step 922 before the matrix multiplications are performed by the propagation at step 923. However, as the amount of data involved can be extremely large, use of a multiplier-accumulator for inferencing has several issues related to the loading of weights. One of these issues is high energy dissipation due to having to use large MAC arrays with the required bit-width. Another issue is high energy dissipation due to the limited size of MAC arrays, resulting in high data movement between logic and memory and an energy dissipation that can be much higher than used in the logic computations themselves.

To help avoid these limitations, the use of a multiplier-accumulator array can be replaced with other memory technologies. For example, the matrix multiplication can be computed within a memory array by leveraging the characteristics of NAND memory and Storage Class Memory (SCM), such as those based on ReRAM, PCM, FeRAM or MRAM based memory cells. This allows for the neural network inputs to be provided via read commands and the neural weights to be preloaded for inferencing. By use of in-memory computing, this can remove the need for logic to perform the matrix multiplication in the MAC array and the need to move data between the memory and the MAC array.

The following presents embodiments for compute-in-memory DNNs that can perform the multiplications between input values and weights of an inferencing operation within an array of memory cells by storing the weights for the layers of a neural network in the memory cells and applying inputs for the layers as voltage levels on word lines of the array. The resultant current on the bit lines corresponds to the product of the inputs with weights, where multiple such multiplications can be performed concurrently. To reduce the power consumed by such inference engines, the following discussion presents embodiments based on multi-level memory cells formed of multiple ultra-thin dielectric layers separated by metallic layers that are part of an array having a crosspoint structure. Embodiments for the memory cells have well-separated low and high resistance states, while still having a high resistance value even for the low resistance state, allowing for very low power consumption when inferencing. To store weights of the DNN, the memory cells can be individually programmed by use of input voltages to selectively break down one or more of the dielectric layers by selection of a programming voltage.

The use of a crosspoint architecture allows for an array with a smaller footprint in which vector multiplication is implemented by a voltage to current conversion process in which the matrix weights are encoded in the resistance values of the cells in the array. The described memory cells can have memory window between the lowest resistance state and highest resistance state with a factor of two or more, while having a lowest resistance state whose resistance is still very high, such a $R_{LRS}>10$ MOhm. Compared to other memory cell technologies, the memory cells described here allow for multi-level cells (MLC) that have less stringent programming requirements and can be programmed with relatively low power on-chip circuitry. In addition, the programming method allows selection of devices without the need for dedicated select transistors for each bit, reducing the footprint of each bit. As the memory device is used for inferencing, the memory device can be preprogrammed with previously determined weight values for a DNN before being supplied to customers.

More specifically, embodiments are presented for a crosspoint inference engine with multi-level storage and electric field programming. The described designs are for a multi-levels cell (MLC) vector multiplication device that is ultralow power, low cost, and does not require special on-chip programming. The inference engine, or vector multiplication device, is made up of a crosspoint array with a cell at each crosspoint junction and the control (or periphery) circuitry configured to supply independent input voltages to each wire in one plane of wires (i.e., word lines) and reading current on each wire in the other wire plane (i.e., bit lines). The vector multiplication involves a multiplication of the input voltages by the matrix weights encoded by the memory cells. The control circuitry and the memory die holding one or more such arrays can be part of the same die or a bonded die pair of a control die and a memory die, such as described above with respect to FIGS. 6A and 6B. In the embodiments presented here, the memory cells of the crosspoint array can be individually programmed to one of multiple resistance states solely using input voltages. In the first set of embodiments described below, the MLC memory cell is formed of a plurality of ultra-thin dielectric layers separated by metallic layers, where the programming of a memory cell is done by selectively breaking down one or more of the dielectric layers by selection of a programming voltage level, hence setting the electrical resistance of the memory cell. In an alternate set of embodiments, the memory cell is based on an anti-fuse, where programming of the anti-fuse base memory cell is performed by a current through each cell and setting a compliance limiting the current flow.

Figure 12A:
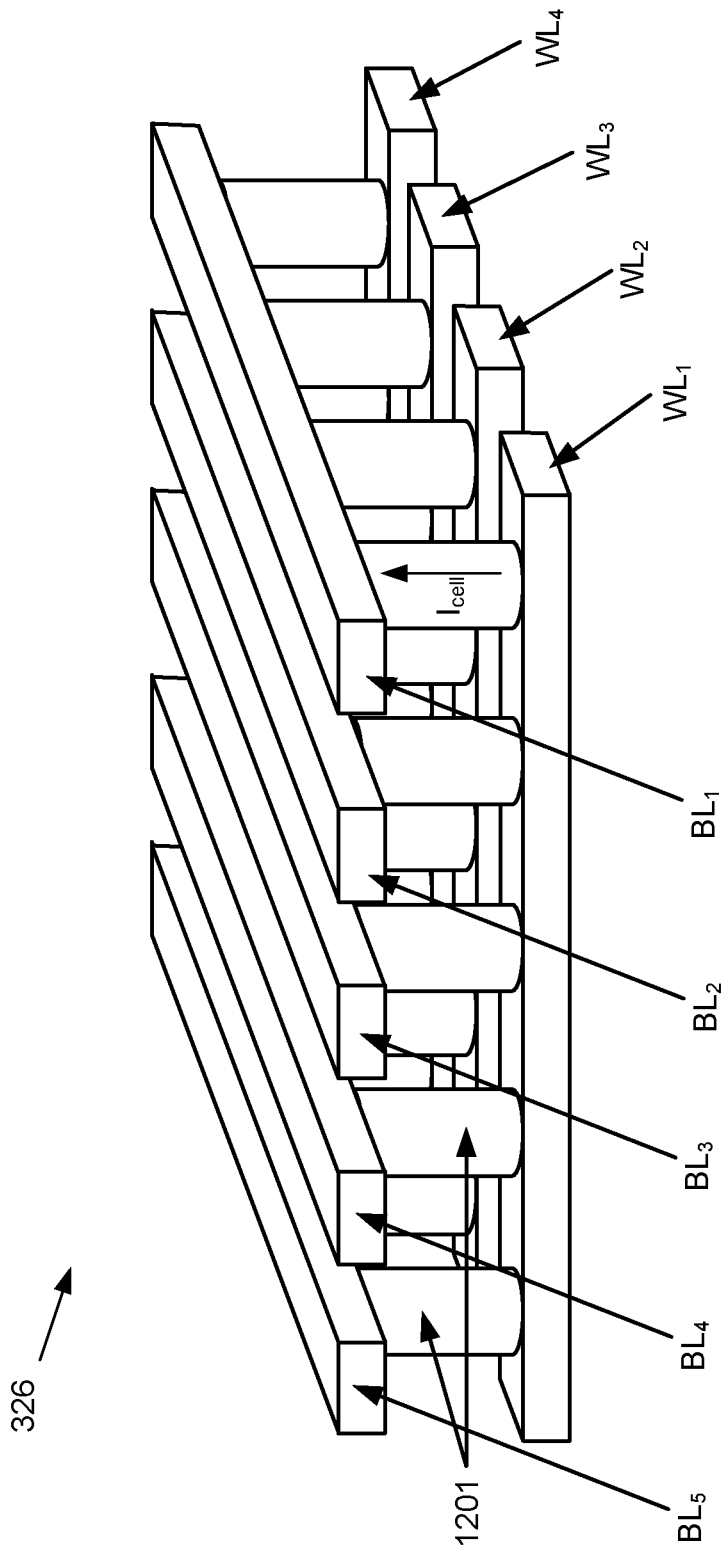
FIG. 12A-12C depict one embodiment of a portion of a memory array that has a cross-point architecture.

FIG. 12A depicts one embodiment of a portion of a memory array 326 that forms a crosspoint architecture in an oblique view. Memory array 326 of FIG. 12A is one example of an implementation for memory array 326 in FIG. 5. The bit lines $BL_1$-$BL_5$ are arranged in a first direction (represented as running into the page) and the word lines $WL_1$-$WL_5$ are arranged in a second direction perpendicular to the first direction. FIG. 12A is an example of a horizontal crosspoint structure in which word lines $WL_1$-$WL_5$ and $BL_1$-$BL_5$ both run in a horizontal direction relative to the substrate, while the memory cells, two of which are indicated at 1201, are oriented so that the current runs in the vertical direction. In a memory array with additional layers of memory cells, there would be corresponding additional layers of bit lines and word lines.

As depicted in FIG. 12A, memory array 326 includes a plurality of memory cells 1201. The memory cells 1201 may include re-writeable memory cells, such as can be implemented using ReRAM, MRAM, PCM, or other material with a programmable resistance. The following discussion will focus on particular structures of non-volatile memory cells, although much of the discussion can be applied more generally. The current in the memory cells of the first memory level may flow upward as indicated by arrow $I_{cell}$.

Figure 12B:
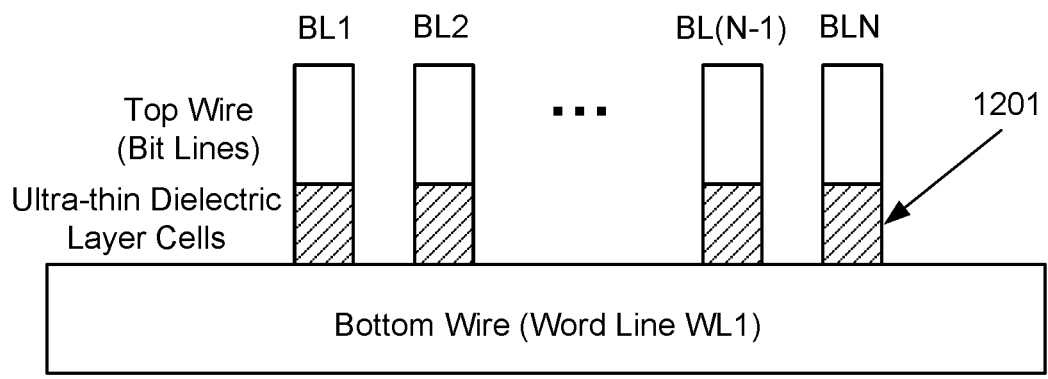
Figure 12C:
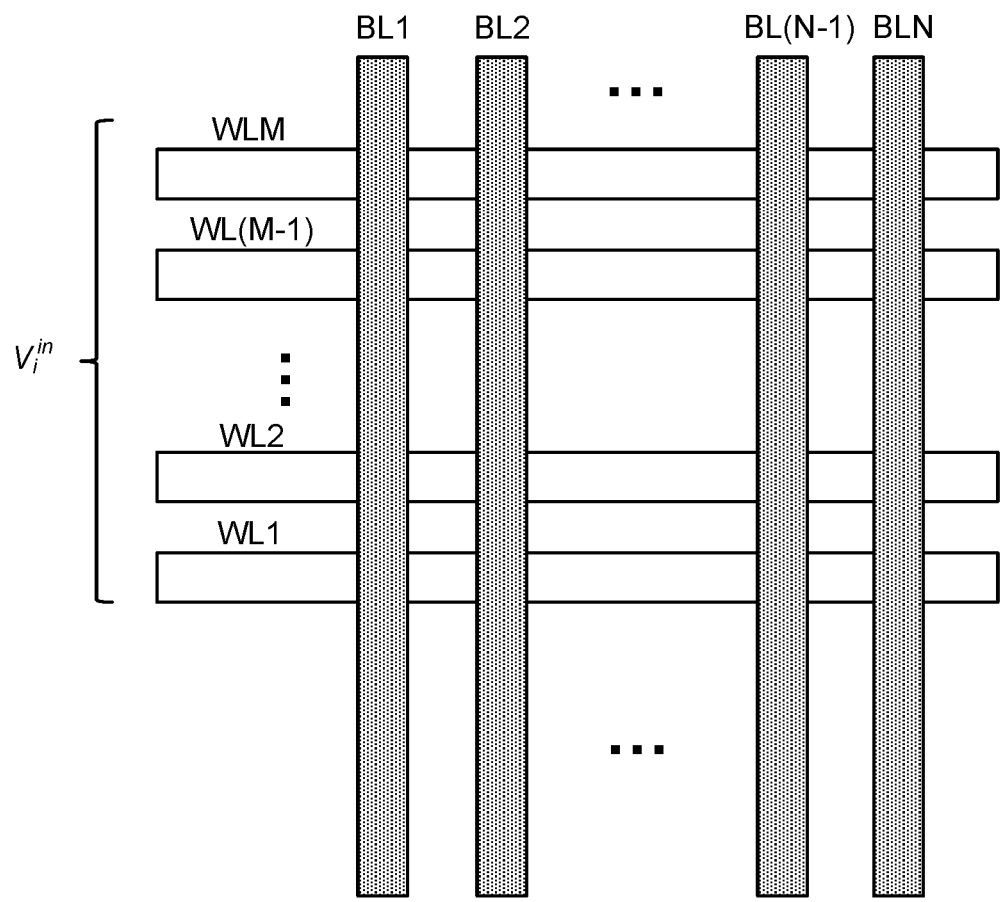

FIGS. 12B and 12C respectively present side and top views of the crosspoint structure in FIG. 12A. The sideview of FIG. 12B shows one bottom wire, or word line, $WL_1$ and the top wires, or bit lines, $BL_1$-$BL_n$. At the crosspoint between each top wire and bottom wire is a multi-level memory cell 1201. FIG. 12C is a top view illustrating the crosspoint structure for m bottom wires $WL_1$-$WL_m$ and n top wires $BL_1$-$BL_n$. In a multi-level embodiment, the memory cell at each crosspoint can be programmed into one of more than two resistance states, such as 2-5 levels. More detail on embodiments for memory cell design and techniques for their programming are given below.

The array structure of FIGS. 12A-12C can be used to perform an array multiplication of an inferencing operation in which the matrix weights for the layers of a neural work are stored in the memory cells as their electrical resistance. Applying the voltage vector $V_i^{in}$ to the inputs of the word lines generates a current in the output of the bit lines that references a vector multiplication of the input voltages with the weights encoded by the memory cell resistances. The weights are encoded as a conductance $b_{i,j}$, which is the inverse of a resistance $R_{i,j}$ of the memory cell at the cross point of word line $WL_i$ and bit line $BL_j$:

$$b_{i,j} = \frac{1}{R_{i,j}}. \quad \text{(Equation 1)}$$

If the input for the layer of the neural network is encoded as voltages $V_i^{in}$ applied to the respective word lines $WL_i$, then the current on each bit line $BL_j$ will be the product:

$$I_j^{out} = \Sigma b_{i,j} * V_i^{in}, \quad \text{(Equation 2)}$$

where the sum is over i. Depending on the embodiment, the weights can be binary valued and stored in binary memory cells, or multi-leveled values stored in MLC memory cells as described below. Similarly, depending on the embodiment, the inputs can be binary valued or have a higher number of values. By concurrently performing a sensing operation on multiple selected word lines, the crosspoint structure will automatically compute the input-weight product for the layer.

Note that under this arrangement, multiple memory cells along a bit line are concurrently selected for sensing, with the corresponding input voltages applied on their corresponding word lines. The current km' corresponds to the combined result for all of these memory cells and this process consequently differs from a normal read operation in which the state of a single memory cell is determined. From the km' of such an inference operation, it is combined result that is determined and the contribution of the individual memory cells would not be known.

Figure 13:
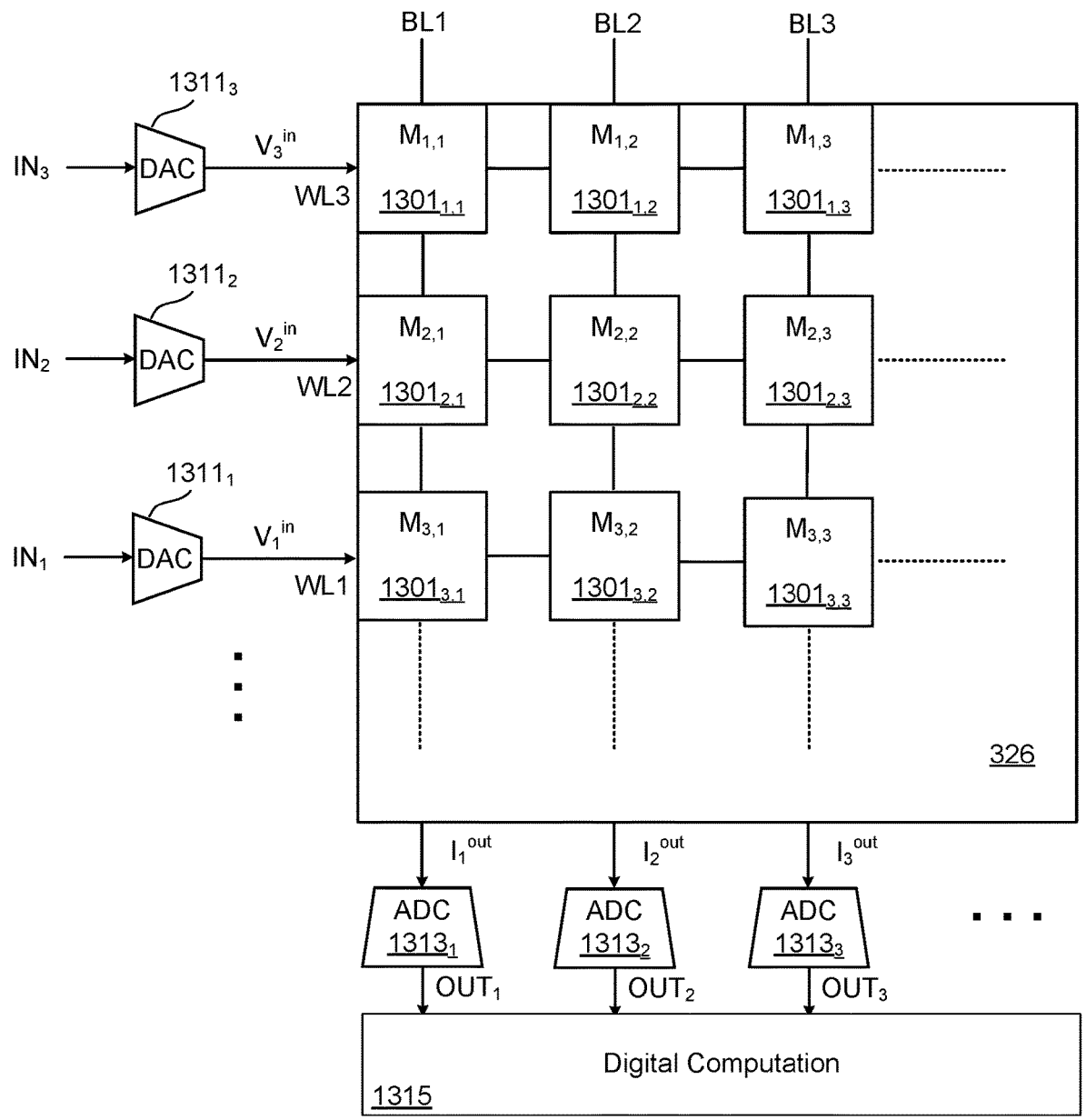
FIG. 13 is a top view of the crosspoint array and some of the control circuits used in operating the array.

FIG. 13 is a top view of the crosspoint array and some of the control circuits used in operating the array, where a 3×3 section of the array is shown. At the crosspoint of each word line $WL_i$ and bit line $BL_j$ is a memory cell $M_{i,j}$ $1301_{i,j}$. The inputs $IN_i$ for a layer of the neural network are converted from input values to voltage levels in the digital to analog converters $1311_i$ to a corresponding voltage level. The inputs $IN_i$ can be the initial input for the network or the output of a preceding layer. In a binary embodiment, a 1 input can be converted into a high read voltage $V_{read}$ and a 0 input can be converted into a low read voltage, such as 0V or ground, in which case the DACs $1311_i$ can be one bit DACs. For multibit inputs, the DACs $1311_i$ would be of a corresponding number of bits. The analog currents $I_j^{out}$ on each of the bit lines $BL_j$ are converted into a digital value in the corresponding analog to digital converter ADC $1311_j$ to generate a digital output $OUT_j$. The output values $OUT_j$ can then go to a digital computation block 1315, which can perform operations such as accumulations for multiply and accumulation operations, apply activations, and other such operations performed as part of propagating an input through a neural network. Referring back to FIGS. 5 and 6A, the DACs $1311_i$, $ADC_j$ $1311_j$ and digital computation block 1315 can be considered part of the row decoder 324, column decoder 332, and read/write circuits 328, along with components of the control circuitry of 310. The DAC and/or ADC can be multi-bit devices, capable of generating or outputting signals quantized in $2^n$ levels, with n>1.

FIG. 14 is schematic representation of a first embodiment of a memory cell design that can be used in a multi-level ultra-low power inference engine. The array uses a crosspoint architecture, with each cell having multiple dielectric layers each with a different resistance $R_i$ and breakdown voltage $V_{BD,i}$. In FIG. 14, a memory cell is located at the crosspoint between a word line 1401 and a bit line 1411. The memory cell has N dielectric layers, three of which are shown as dielectric 1 1407 with $R_1$ and $V_{BD,1}$, dielectric i 1405 with $R_1$ and $V_{BD,i}$, and dielectric N 1403 with $R_N$ and $V_{BD,N}$. In between the dielectric layers are conductive layers, such as shown at 1404 and 1406. A metallic layer 1402 can also be included between the word line 1401 and the most adjacent of the dielectric layers, here dielectric N 1403, and a metallic layer 1408 can also be included between the bit line 1411 and the most adjacent of the dielectric layers, here dielectric 1 1407. In the example here, the dielectric layers will be arranged so that their resistance levels progressively decrease from $R_1$ to $R_N$, but other orders can be used. The dielectric layers are formed so that the differences between the resistance levels of the different layer are large enough so that the different programmed states are well-defined.

The breakdown voltage $V_{BD}$ of a dielectric layer is the voltage at which the dielectric layer goes from a high resistance state to an electrical short, $R_{short} \ll R_i$, for a given dielectric layer. In the example embodiment, the dielectric layers are formed so that the initial resistances $(R_1, \ldots, R_N)$ and breakdown strengths $(V_{BD,1}, \ldots, V_{BD,N})$ are tuned so that the layers with higher resistance have a lower $V_{BD}$. The resistance and break down strengths can be controlled by tuning the thickness, defect density, and material composition of each dielectric layer. In this manner a memory cell's resistance can be set by progressively increasing the programming stress to break down more dielectric layers and lower the overall cell resistance.

For example, looking at the programming of a cell with three dielectric layers, the cell is formed such that $R_1 \gg R_2 \gg R_3$ and $V_{BD,1} \ll V_{BD,2} \ll V_{BD,3}$. In this example, nearly all the voltage is dropped across the highest resistance (or lowest number subscript) non-shorted dielectric layer. Initially, with all dielectric layers intact, the cell starts in the highest resistance state: $R_{cell} = R_1 + R_2 + R_3 \approx R_1$. To program the memory cell to have a resistance of $R_3$, for example, a programming or write voltage $V_{wr}$ is placed across the memory cell to break down layers 1 and 2, but not layer 3: $V_{BD,1} < V_{BD,2} < V_{wr} < V_{BD,3}$. This leaves on dielectric layer 3 intact so that $R_{cell} = R_3$.

FIG. 15 is a schematic representation of another set of embodiments of a memory cell design using grouped dielectric layers that can be used in a multi-level ultra-low power inference engine. As in FIG. 14, the memory cell is located at the crosspoint between a word line 1501 and bit line 1511 and is formed of a number of alternating dielectric layers and conductive layers, but now the dielectric layers grouped are into tiers with different numbers of layers, but with intra-tier identical or very similar layers properties. In this example, for a tier i there will i layers, but other embodiments can be arranged differently. FIG. 15 illustrates an example of N tiers, each comprised of N layers, where only tiers 1 and 2, and the last layer of tier N, are explicitly shown. Dielectric tier T1 has one layer L1 1527-1 and is separated from bit line 1511 by metal layer 1530 and from the tier 2 dielectric layers 1525-1 and 1525-2 by metal layer 1528. The second dielectric tier is formed of pair of layers L1 1525-1 and L2 1525-2, which are separated by an inter-tier metallic layer 1526, and where tier 2 is separated from first layer of tier 3 by the metallic layer 1524. The first layer of tier 3 and other intervening dielectric and metallic layers are not shown except for Nth layer 1523-N of the Nth tier, which is then separated from the word line 1501 by the metallic layer 1522.

In the example embodiment of FIG. 15, the tiers are ordered so that the lower numbered tiers have higher resistance and the higher numbered tiers can contain more layers than lowered number tiers. For example, the resistance of tier $T_i$ is $$R_{Ti} = \Sigma_1^i R_{Ti,Ln}, \quad \text{(Equation 3)}$$

where the sum is over n, with $R_{Ti} > R_{T(i+1)}$, even though Ti has fewer layers that tier T(i+1). In one set of embodiments, break down voltage $V_{BD}$ for all layers can be formed to be nominally the same. In this way, applying a voltage $n^*V_{BD}$ will break down all tiers up to tier n.

Considering the procedure for programming a cell in an example with three tiers for a total of (1+2+3=) 6 layers, the layers can be designed and formed so that $R_{T1} \gg R_{T2} \gg R_{T3}$ and $V_{BD}$ of each layer is similar. (Resistance is typically exponentially sensitive to thickness, while $V_{BD}$ is only linearly dependent on thickness.) As in the case of the embodiment of FIG. 14, the great majority of the memory cell's total resistance will come from the intact tier with the highest resistance (the lowest numbered subscript as presented here) tier, the great majority of a voltage applied across the memory cell will be dropped across this highest resistance non-shorted tier. To program the cell to have resistance $R_{T3}$, for example, a programming voltage $V_{wr}$ is applied to break down each of the layers in tiers T1 and T2. In this case, $V_{wr}$ is taken so that $2^*V_{BD} < V_{wr} < 3^*V_{BD}$.

Considering the writing of data (i.e., weight values) to the array, embodiments presented here use applied voltages to selectively program the memory cells, such as those described with respect to FIGS. 14 and 15, to one of multiple resistance values. For example, an embodiment with N layers/tiers can be programmed to N states, although, for the low power inferencing of concurrent sensing along multiple word lines, the state with all of the dielectrics shorted can be avoided, but in some embodiments an additional resistance can be formed in series with the cell to avoid excessive current. The electrical selection of the memory cells selected to be written is done using a half-select scheme, as illustrated with respect to FIG. 16.

Figure 16:
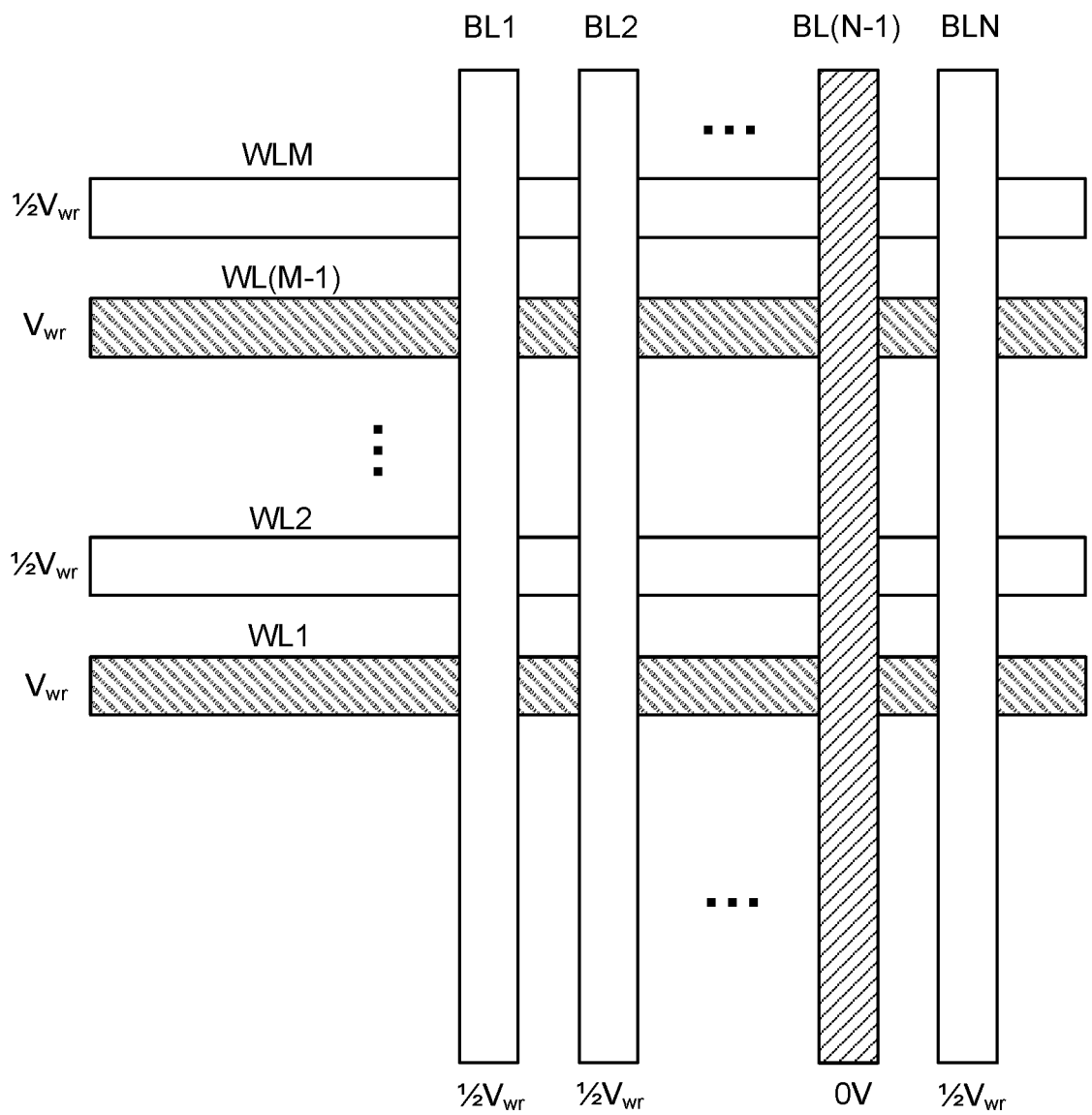
FIG. 16 illustrates a half-select scheme for selection of memory cells to be programmed.

FIG. 16 illustrates a half-select scheme for selection of memory cells to be programmed. Voltages are applied to the top (bit lines) and bottom (word line) wires so that cells along a bit line that are intended to be written have a write voltage $V_{wr}$ of voltage applied across the bottom and top wire, where the value of $V_{wr}$ is selected to provide the programming voltage of the target data state. Cells that are not to be written experience either only half of the voltage drop ($V_{wr}/2$) or no voltage drop. In the example of FIG. 16, the two cells at intersection of bit line $BL_{(N-1)}$ and word lines $WL_1$ and $WL_{(M-1)}$ are selected for writing, with $V_{wr}$ applied on the selected word lines and 0V on the selected bit line. The other word lines and bit lines are set to ½ $V_{wr}$. This places a differential of $V_{wr}$ across the selected memory cells and either 0V or ½ $V_{wr}$ across non-selected memory cells. If $V_{wr.max}$ is the maximum programming voltage and $V_{wr.min}$ the minimum programming voltage, then these values should be configured such that ½$V_{wr.max} < V_{wr.min}$, otherwise the half-select voltage will break down part of unselected cells. The programming can be performed sequentially bit line by bit line, as discussed in more detail below. (In the half-select process described here, the low voltage level is taken at 0V and the half-select values of ½$V_{wr}$ is used. More generally, these can be another low voltage value and the half-select voltage level can be other voltage levels intermediate to $V_{wr}$ and the low voltage, as long as the half-select process does not induce unwanted programming or reading values.)

The memory cell programming in the crosspoint inference engine with a plurality of dielectric layers is done through selectively breaking down, for the memory cells not selected to be left in the highest resistance state, part or all of the dielectric layers by applying an appropriate program voltage $V_{wr}$. The number of levels in each cell is limited by the margin between the largest half-select voltage (½$V_{wr.max}$) and the smallest select voltage ($V_{wr.min}$) so that ½$V_{wr.max} < V_{wr.min}$, the ability to control the dielectric layers' resistance distributions, and any design rule limiting the thickness of the multi-level memory cells' formation. Relative to other memory technologies, this memory cell structure allows for almost any resistance state combination to be implemented and can be formed from simple dielectric layers of any material commonly available in semiconductor fabrication plants (SiO$_2$, HfO$_2$, MgO, etc.). Although the memory cells can only be programmed once, in applications as an inference engine the weights of the layers of the neural network can be written in prior to the device being provided to end user, such as being done at a fabrication facility at the end of the test processes that a device typically undergoes, or by a third party such as an original equipment manufacturer that programs the weights of their DNN model into memory arrays used by a processor implementing the DNN on an application such as an autonomous vehicle, to take one example.

FIG. 17 is a schematic representation of an embodiment for a sequence for writing a crosspoint memory with memory cells formed of multiple dielectric layers. A programming operation to write the network weight values of a neural network or other data to the crosspoint array will typically need to access all or most of the word lines, all or most of the bit lines, and program all of the data states, which will require multiple $V_{wr}$ values for non-binary embodiments. As all of these different combinations cannot, outside very unusual sets of data values, be achieved concurrently, a write operation will involve a sequential operation. As described with respect to FIG. 16, the programming can be performed for the memory cells on one or more word lines along a shared word line, so that word lines can be programmed on an individual basis or multiple word lines currently in order to increase parallelism. The number of word lines that can be programmed concurrently can be all of the word lines of the array, or a fewer number if power/current considerations limit the number. In multi-level cell embodiment, a corresponding number of different $V_{wr}$ values are used in a programming operation. For a given bit line, multiple $V_{wr}$ can be applied concurrently to program multiple data states concurrently; however, if not biased properly in a half-select embodiment, programming multiple data states concurrently can induce programming on non-selected memory cells. The example embodiments here write the selected memory cells on a single bit line for all of the bit lines being programmed to the same state. Depending on the embodiment, the programming sequence can either be performed bit line by bit line for a given data state and then repeated to cover all of the data states, or for a given bit line all data states can be programmed before moving on to the next bit line.

FIG. 17 illustrates programming each bit line in the array in sequence, starting at $BL_0$ and progressing sequentially to $BL_n$. As notated in FIG. 17, the memory cells selected to be programmed on the selected bit line are labelled S and the memory cells not selected to be programmed are labelled NS. The bit line to be programmed is selected by grounding, or setting to low voltage, the respective bit line, while setting all other bit lines at $V_{wr}/2$, or the intermediate "half-select" write voltage. The memory cells selected to be programmed on the bit line are selected by applying $V_{wr}$ to the respective word lines, while setting all other word lines at $V_{wr}/2$. In a multi-level cell embodiment, for a selected bit line the $V_{wr}$ value can progress through all of the corresponding programming voltage levels. For example, at left in FIG. 17 the memory cells on bit line $BL_1$ and word lines $WL_2$ and $WL_m$ are selected to be written for one of the programmed states, and at right in FIG. 17 the memory cell on bit line $B_{Ln}$ and word line $WL_1$ is selected to be written to one of the programmed states.

In an embodiment where all of the data states are written to the memory cells on a given bit line before moving to the next bit line in the sequence, the non-selected word line and bit lines are half-selected at $\frac{1}{2}V_{wr}$ and will consequently also be stepped up as the programming voltage $V_{wr}$ is raised for the different data states to be programmed. In alternate embodiments where all of the bit lines are cycled through for one $V_{wr}$ before cycling through all of the bit lines at the next $V_{wr}$ in sequence of programming voltages, non-selected word lines and bits lines will stay at the same $\frac{1}{2}V_{wr}$ for a given cycle through the bit lines, with the bit lines switching between at $\frac{1}{2}V_{wr}$ and 0V when a bit line is selected/deselected and the word lines switching between $\frac{1}{2}V_{wr}$ and $V_{wr}$ as word lines are selected/deselected as the programming flow cycles through the bit lines for a given at $V_{wr}$.

Referring back to FIGS. 5 and 6A, the control circuitry involved in the reading and writing of the memory cells can be part of the row decoder 324, column decoder 332, and read/write circuits 328, along with components of the control circuitry of 310, such as the state machine 312. During a write operation, drivers/biasing circuitry within the row decoder 324 and column decoder 332 can bias the word lines and bit lines as illustrated with respect to FIG. 19 so that the memory cells individually selected for programming.

With respect to the reading of data in an inferencing operation, as described with respect to FIG. 12C, rather than determine the data state of individual memory cells, the biasing circuitry within the row decoder 324 converts an input vector for a layer of the network into a set of $V^{in}$ values that are concurrently applied to the word lines of the memory cells of selected set bit lines. The column decoder 332 and read/write circuits 328, including the sense amplifiers 350, will determine the total $I^{out}$ along each of the word lines as a multi-bit sensing operation to indicate the product of the input vector with the weight values stored along the corresponding bit line. As the memory cells described here can have a high resistance value even in the lowest resistance state, even when concurrently sensing multiple memory cells, the current values can still be comparatively low and the inferencing process a low power process. The control circuitry on the memory device can then accumulate the multiplication results as part of a multiply and accumulate operation to determine an output for the neural network's layer, which can either be an input to a subsequent layer or an output for the network.

Figure 18C:
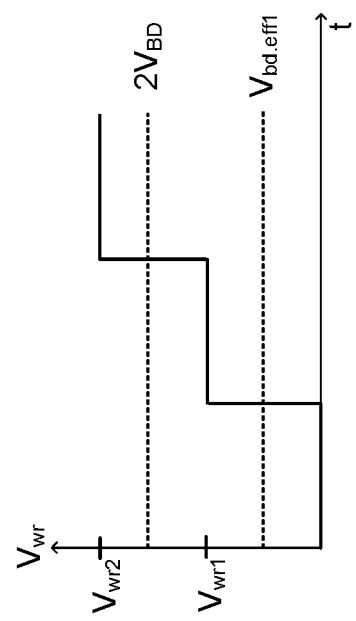
FIGS. 18A-18C illustrate the writing mechanism by dielectric breakdown in the example of two tiered layers.
Figure 18A:
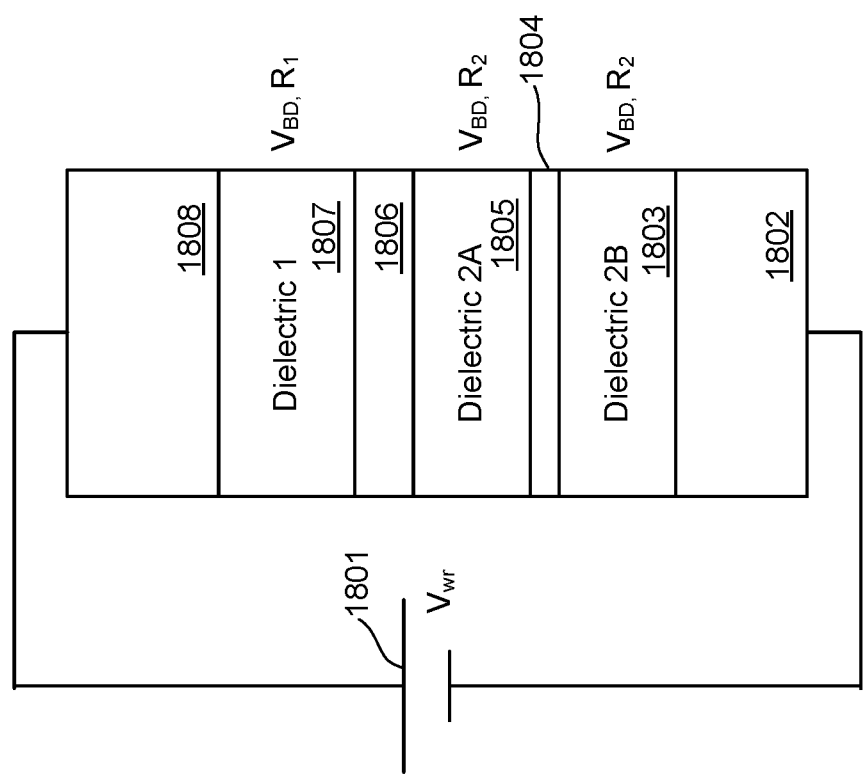
Figure 18B:
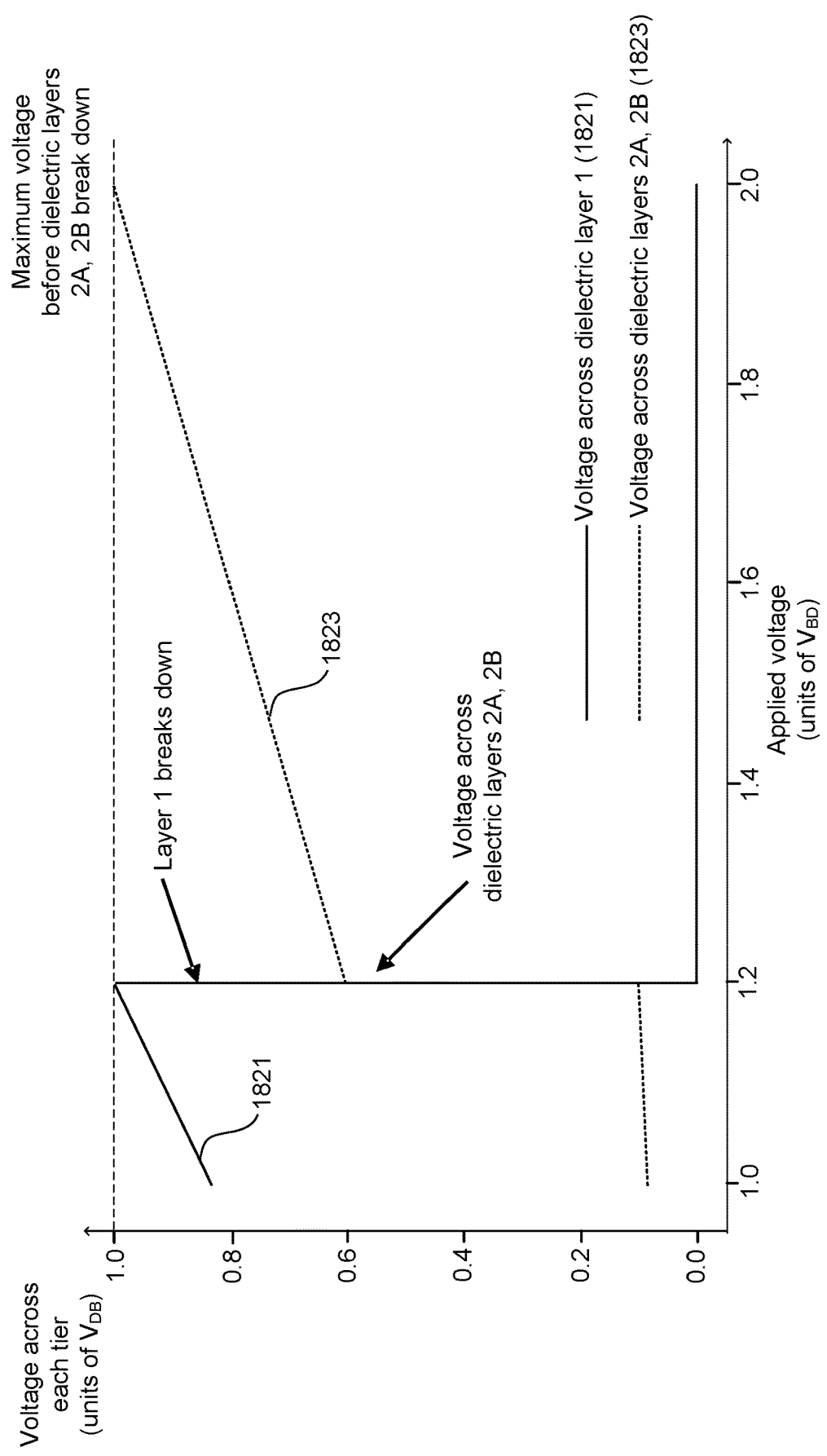

FIGS. 18A-18C illustrate the writing mechanism by dielectric breakdown in the example of a two tiered layers. FIG. 18A is a schematic representation of a two tier memory cell. The first tier is a single layer dielectric 1 1807 with a breakdown voltage $V_{BD}$ and resistance $R_1$ formed between conductive layers 1806 and 1808. The second tier between the conductive layers 1802 and 1806 is formed of the two layers of dielectric 2A 1805 and dielectric 2B 1803, each with a breakdown voltage $V_{BD}$ and resistance $R_2$, and separated by a conductive layer 1804. The programming voltage $V_{wr}$ applied across the memory cell by the corresponding word line and bit line is represented by the voltage source 1801. The memory cell can be at a level 0, corresponding to the highest resistance state with none of dielectric layers broken down: in a level 1, when dielectric 1 1807 has been broken down while dielectrics 2A 1805 and 2B 1803 are intact; and a level 2, where dielectrics 2A 1805 and 2B 180 are also broken down. In a binary embodiment, levels 0 and 1 would be used and respectively correspond to a high resistance state and a low resistance state. When operated as a three state device, level 0 would be the high resistance state, level 1 an intermediate resistance state, and level 2 the low resistance state. As all of the dielectric layers are shorted out in level 2, level 2 may have a very low resistance and would be consume more power. When operated as a three state memory cell, some embodiments can add a series resistance to the memory cell in order to allow usage for low power inferencing.

FIG. 18B is a plot of the voltage across each of tiers, normalized relative to the breakdown voltage $V_{BD}$, versus the applied voltage across the whole of the memory cell from voltage source 1801, again normalized in terms of $V_{BD}$. In the example FIG. 18B, $R_1=10\ R_2$, so that the memory cells act a voltage divider and the relative voltage dropped across each layer will vary as the ratio of its resistance to the total cell resistance. This is reflected in the plots of FIG. 18B, where 1821 is the voltage drop across dielectric 1 1807 and 1823 is the voltage drop across each of dielectric 2A 1805 and dielectric 2B 1803.

Looking at the applied voltage across the whole memory cell (x-axis) staring at an applied voltage of $V_{BD}$ (1 on the normalized scale), at $1.0V_{BD}$ the voltage drop across dielectric 1 1807 is less than $V_{BD}$ as part of the voltage is dropped across tier 2. As the applied voltage is increased, the voltage across all of the dielectric layers is increased until the voltage across the memory cell is ~$1.2V_{BD}$, where dielectric 1 1807 will break down. Once dielectric 1 1807 breaks down, there is no voltage drop across dielectric 1 1807, so that the applied voltage is dropped across dielectric 2A 1805 and dielectric 2B 1803, with half of the applied voltage dropped across each of dielectric 2A 1805 and dielectric 2B 1803 as they have the same resistance of $R_2$.

To break down the dielectric of the tier 2 dielectrics dielectric 2A 1805 and dielectric 2B 1803, the applied voltage will need to exceed $2V_{BD}$. Consequently, to program the level 1 data value into the memory cell, the program voltage $V_{wr}$ should be such that ~$1.2V_{BD}<V_{wr}<2V_{BD}$. If $V_{bd.eff.i}$ is the effective breakdown voltage for tier i then, taking into account voltage dividers, initially the breakdown voltage as seen across dielectric 1 1807 $V_{bd.eff.1}=V_{bd}*(R_1+2*R_2)/R_1$. After dielectric 1 1807 breaks down, all of the voltage drop will be across the serial pair of dielectric 2A 1805 and dielectric 2B 1803, so that $V_{bd.eff.2}=2*V_{bd}$. The condition to have sufficient margin between the level 0 and level 1 states is $V_{bd.eff.1}<V_{bd.eff.2}$, so that $R_1>2*R_2$.

When programming data to an array of memory cells as illustrated in FIG. 18A, FIG. 18C illustrates a waveform of a sequence of steps for the write voltage $V_{wr}$ to apply to word lines corresponding to memory cells to be programmed as described above with respect to FIG. 17. The waveform of FIG. 18C is an embodiment for the $V_{wr}$ levels applied to selected word lines in a write operation. Initially all of the memory cells are at level 0 and memory cells with a target state of level 0 state will not be programmed from this initial state. To write level 1 states, a programming voltage of $V_{wr}$ is applied to selected word lines such that $V_{wr}>V_{bd.eff.1}$ and $V_{wr}<2V_{BD}$. If dielectric 2A 1805 and dielectric 2B 1803 are also to be broken down for a level 2, then $V_{wr}$ is then raised to $V_{wr}>2V_{BD}$ for the memory cells selected to be written to level 2.

FIGS. 19A and 19B illustrate the writing mechanism by dielectric breakdown in the example of a three tiered layer memory cell. FIG. 19A is a schematic representation of such a three tier memory cell where the first tier is a single layer dielectric 1 1913 with a breakdown voltage $V_{BD}$ and resistance $R_1$ between conductive layers 1914 and 1912. The second tier is formed between the conductive layers 1908 and 1912 has the two layers of dielectric 2A 1911 and dielectric 2B 1909, each with a breakdown voltage $V_{BD}$ and resistance $R_2$ and separated by a conductive layer 1908. A third tier between conductive layers 1908 and 1902 is formed of the three layers of dielectric 3A 1907, dielectric 3B 1905, and dielectric 3C 1903 with inter-dielectric conductive layers 1906 and 1904. The programming voltage $V_{wr}$ applied across the memory cell by the corresponding word line and bit line is represented by the voltage source 1901. The memory cell can be: at a level 0, corresponding to the highest resistance state with none of dielectric layers broke down; at a level 1, when dielectric 1 1913 has been broken down while dielectrics 2A 1911 and 2B 1909 and dielectrics 3A 1907, 3B 1905, and 3C 1903 are intact; at a level 2, where dielectrics 2A 1911 and 2B 1909 are also broken down; and at a level 3 when the tier 3 dielectrics 1907, 1905, and 1903 are broken down. In a ternary embodiment, levels 0, 1 and 2 would be used and respectively correspond to a high resistance state, intermediate resistance state, and a low resistance state. When operated as a four state device, level 0 would be the high resistance state, levels 1 and 2 intermediate resistance states, and level 3 the low resistance state. As all of the dielectric layers are shorted out in level 3, level 3 may have a very low resistance and would be consume more power, so that when operated as a three state memory cell, some embodiments can add a series resistance to the memory cell in order to allow usage for low power inferencing. For a three level, three tiered system, the margin conditions are $V_{bd.eff.1}<V_{bd.eff.2}$, or $V_{bd.eff.1}=i*V_{bd.eff.2}$ for a factor i such that $0.5<i<1$ in order to satisfy $\frac{1}{2}V_{wr.max}<V_{wr.min}$. Similarly, $V_{bd.eff.2}<V_{bd.eff.3}$, or $V_{bd.eff.2}=n*V_{bd.eff.3}$ for a factor n, where $n<1$. In units of $V_{bd}$ and $R_3$, this give the condition $R_2=3/(3*n-2)$ and $R_1=3n*R_2/(3*n*i-1)$.

When programming data to an array of memory cells as illustrated in FIG. 19A, FIG. 19B illustrates a waveform of a sequence of $V_{wr}$ steps to apply to word lines corresponding to memory cells to be programmed as described above with respect to FIG. 17. The waveform of FIG. 19B is an embodiment for the $V_{wr}$ levels applied to selected word lines in a write operation. Initially all of the memory cells are at level 0 and memory cells with a target state of level 0 will not be programmed from this initial state. To write level 1 states, a programming voltage of $V_{wr}$ is applied to selected word lines such that $V_{wr}>V_{bd.eff.1}$ and $V_{wr}<V_{bd.eff.2}$ in order to break down the tier 1 dielectric, but not the tier 2 or tier 3 dielectrics. To write level 2 states, a programming voltage of $V_{wr}$ is applied to selected word lines such that $V_{wr}>V_{bd.eff.2}$ and $V_{wr}<3V_{BD}$ in order to break down the tier 2 dielectrics, but not the tier 3 dielectrics. If dielectric 3A 1907, dielectric 3B 1905, and dielectric 3C 1903 are also to be broken down for a level 3 then $V_{wr}$ is then raised to $V_{wr}>3V_{BD}$ for the memory cells selected to be written to level 3.

Figure 20:
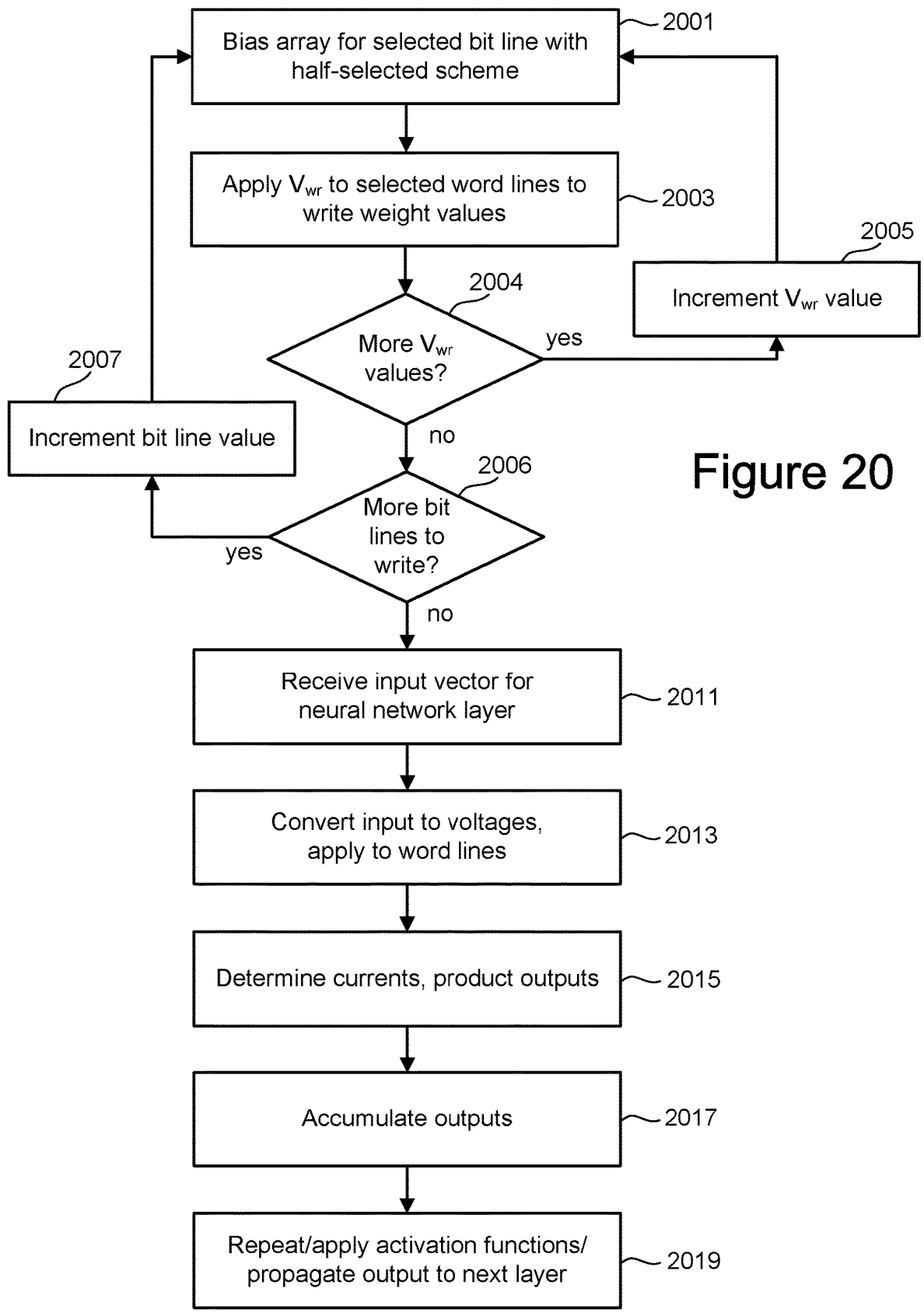
FIG. 20 is a flowchart illustrating an embodiment for the use of a crosspoint architecture using memory cells with ultra-thin dielectric layers for an inference engine.

FIG. 20 is a flowchart illustrating an embodiment for the use of a crosspoint architecture using memory cells with ultra-thin dielectric layers for an inference engine. The flow of FIG. 20 includes both an embodiment of a method for programming the crosspoint memory array (steps 2001-2007) and the subsequent use of the memory array for inferencing (2011-2019). Although the description here is in the context of an inference engine for a neural network and the described structures and techniques can be of particular utility in such applications, they can be more generally applied as low power non-volatile memory with high retention can used in many contexts.

At step 2001 the array is biased for a selected one of the bit lines, where the programming sequence can start with BL0 as illustrated with respect to FIG. 17. For example, the selected bit line can be biased to ground, with the other bit lines and non-selected word lines for the current $V_{wr}$ value being half selected at $\frac{1}{2}V_{wr}$. At step 2003 the programming voltage $V_{wr}$ is applied to the word lines corresponding to the memory cells to be programmed to the data state corresponding to the $V_{wr}$. The biasing of the word lines and bit lines at steps 2001 and 2003 can be performed by one or more control circuits including the biasing circuitry within the row decoder 324 and the column decoder 332 and read/write circuits 328.

The process of steps 2001 and 2003 is repeated for each bit line and, for multi-level cell embodiments, each $V_{wr}$ value. In the embodiment of FIG. 20, the $V_{wr}$ loop is within the bit line loop, but other embodiments can reverse this order. At step 2004 it is determined whether there are more programming voltages $V_{wr}$ for the selected bit line and, if so, the $V_{wr}$ value is incremented to the next programming value at step 2005, such as being stepped to the $V_{wr}$ value corresponding to shorting out the next tier of dielectric layers or the next dielectric layer, and then looped back to step 2001 to accordingly re-bias the currently non-selected word lines to be half-selected. If there are no more $V_{wr}$ values to write at step 2004, the flow goes to step 2006 to determine whether there are more bit lines to write and, if so, the bit line is incremented at step 2007 before looping back to step 2001; and, if not, the programming of the memory array is complete.

In applications such as an inference engine, the programming of an array would typically done prior to being provided to the end user. For example, the memory array can be programmed by the manufacturer prior to shipping, such as at the end of the testing processes that are commonly performed on fresh devices. Alternately, the memory array could be programmed by an intermediate party before supplied to the end user: for example, the unprogrammed memory array (either initialized or not) could be provided to an original equipment manufacturer (OEM), who could then program their data (such as weights for a DNN model), and then supply a product that incorporates the programmed array to the OEM's customer. This would be the case of, for example, an autonomous vehicle that relied upon neural networks and the manufacturer would program the weights of their neural network models into the arrays before the vehicle is provided to the end operator.

As the memory array will typically only be programmed once prior to being supplied to the end user, in some embodiments the programming voltages $V_{wr}$ may not be generated on memory device itself, but externally supplied during programming. In this case, the one or more control circuits on the memory device, such as power control 316, do not need to have the capability to generate the $V_{wr}$ and circuit elements such charge pumps and circuitry to handle the higher voltages can be avoided, saving on area and power consumption for these circuits.

Steps 2011-2019 consider when the memory array is used as an inferencing engine network in a neural network in which the weights are stored as values in the memory cells of the array and input will be a vector of input values. As illustrated above with respect to FIG. 13, the input vector $IN_i$ is converted by the DACs 1311$_i$ into the voltage levels $V_i^{in}$ that are applied to the corresponding word lines $WL_i$, wherein the input values can be binary or multi-level depending on the embodiment. The current flowing between a word line $WL_i$ and $BL_j$ corresponds to the product of the input vector component $V_i^{in}$ and the matrix weight $b_{i,j}$ stored in memory cell 1301$_{i,j}$. The total current $I_j^{out}$ will be equal to the sum of the vector product of the input vector represented by voltage levels $V_i^{in}$ and the values in the j-th matrix column represent by weights stored in memory 1301$_{i,j}$ for the corresponding $BL_j$. The output currents $I_j$ represent the output vector of the in-memory matrix multiplication as described above by Equations 1 and 2.

Step 2015 determines the current $I_j^{out}$ on each of the bit lines $BL_j$ that correspond to the product of Equation 2, which is converted by the ADCs 1313$_j$ into the $OUT_j$. These partial products of the individual columns can then be accumulated in the digital computation block 1315 to generate the output for the layer in step 2017. Step 2019 corresponds to the additional propagation of the output from step 2017. Depending on the embodiment, step 2017 can include applying activation functions, repeating the early steps of the inferencing operation for additional values, providing the output of the layer, or some combination of these. The output of the layer can then be used as the input to a subsequent layer of the network or final output for the network, depending on the layer's location within the network.

An alternate set of embodiments, an inference engine with a cross-point architecture can be based on anti-fused type memory cells, where each memory cell includes an anti-fuse at each cross-point. As with the embodiments based on thin dielectric layers, an anti-fuse embodiment is a write once, read many type of array where programming is performed by a flow similar to that described with respect to FIG. 20 in a binary embodiment. Anti-fuse based embodiments can achieve very high resistance level (such as in the giga-Ω or tera-Ω range) and the low resistance level can be raised through use of a large series resistor. Anti-fuse technology can be implemented down to small scales (i.e., 10 nm) and multi-level resistance states can be implemented.

An anti-fuse is a one time programmable device that is normally OFF in the un-programmed state and normally ON in the programmed state, although in some embodiments it is possible to define multiple resistance levels after programming by modifying the biasing of anti-fuse, which results in a compliance current. A common design for an anti-fuse is a select transistor connected in series with an anti-fuse transistor between a supply level and a bit line. The select transistor has a control gate connected to a read word line and the anti-fuse transistor has a gate connected to programming word line. An anti-fuse is programmed by applying a high voltage to programming word line to breakdown the oxide in the anti-fuse transistor and short out the anti-fuse transistor. To read an anti-fuse, a voltage is applied to the read word line to turn on the select transistor while the programming word line is low, so that current can flow through a programmed anti-fuse, but un-programmed anti-fuses will not conduct current.

The following discussion presents embodiments of a cross-point memory using a single normally-off Field Effect Transistor (FET) anti-fuse cell. The anti-fuse cell is based on a FET with a metal oxide gate (e.g. a high-k metal gate) or a semiconductor oxide gate (e.g. $SiO_2$). The FET channel is non-conductive in its initial state and becomes shorted after the gate oxide has been programmed, i.e. electrically broken down. Embodiments for the specifics of materials vary depending on the lithography node chosen for the design. The programming of the anti-fuse can be illustrated with respect to FIG. 21.

Figure 21:
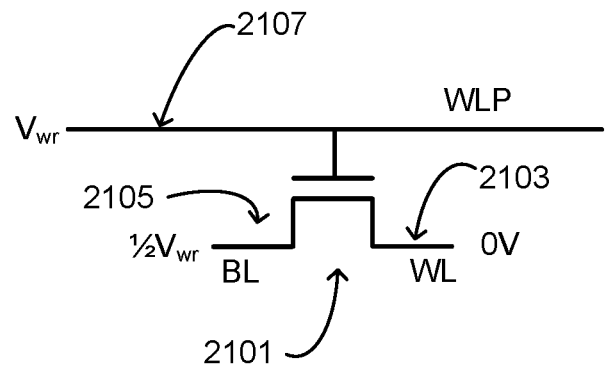
FIG. 21 is a schematic representation of an anti-fuse based on a single FET and an embodiment for the biasing to program the anti-fuse.

FIG. 21 is a schematic representation of an anti-fuse based on a single FET and an embodiment for the biasing to program the anti-fuse. The FET transistor 2101 is connected between a bit line BL 2105 and a word line WL 2103. A third line, or programming word line, WLP 2107 is connected to the control gate of FET 2101. FIG. 21 illustrates the biasing of the FET 2101 for programming, where programming of the anti-fuse is performed by raising the programming word line WLP 2107 to a write voltage $V_{wr}$ while grounding the word line WL 2103 and setting the bit line BL 2105 to $\frac{1}{2}V_{wr}$. The programming voltage $V_{wr}$ is selected so that it is sufficient to yield oxide breakdown of the anti-fuse transistor, while $\frac{1}{2}V_{wr}$ does not cause oxide breakdown, allowing cell selection in a cross-point array. To increase the resistance of the low resistance state, each anti-fuse FET 2101 can have a resistance connected in series between the bit line BL 2105 and the word line WL 2103. (In the half-select process described here, the low voltage level is taken at 0V and the half-select values of $\frac{1}{2}V_{wr}$ is used; but more generally these can be another low voltage value and the half-select voltage level can be other voltage levels intermediate to $V_{wr}$ and the low voltage, as long as the half-select process does not induce unwanted programming or reading values.)

Figure 22:
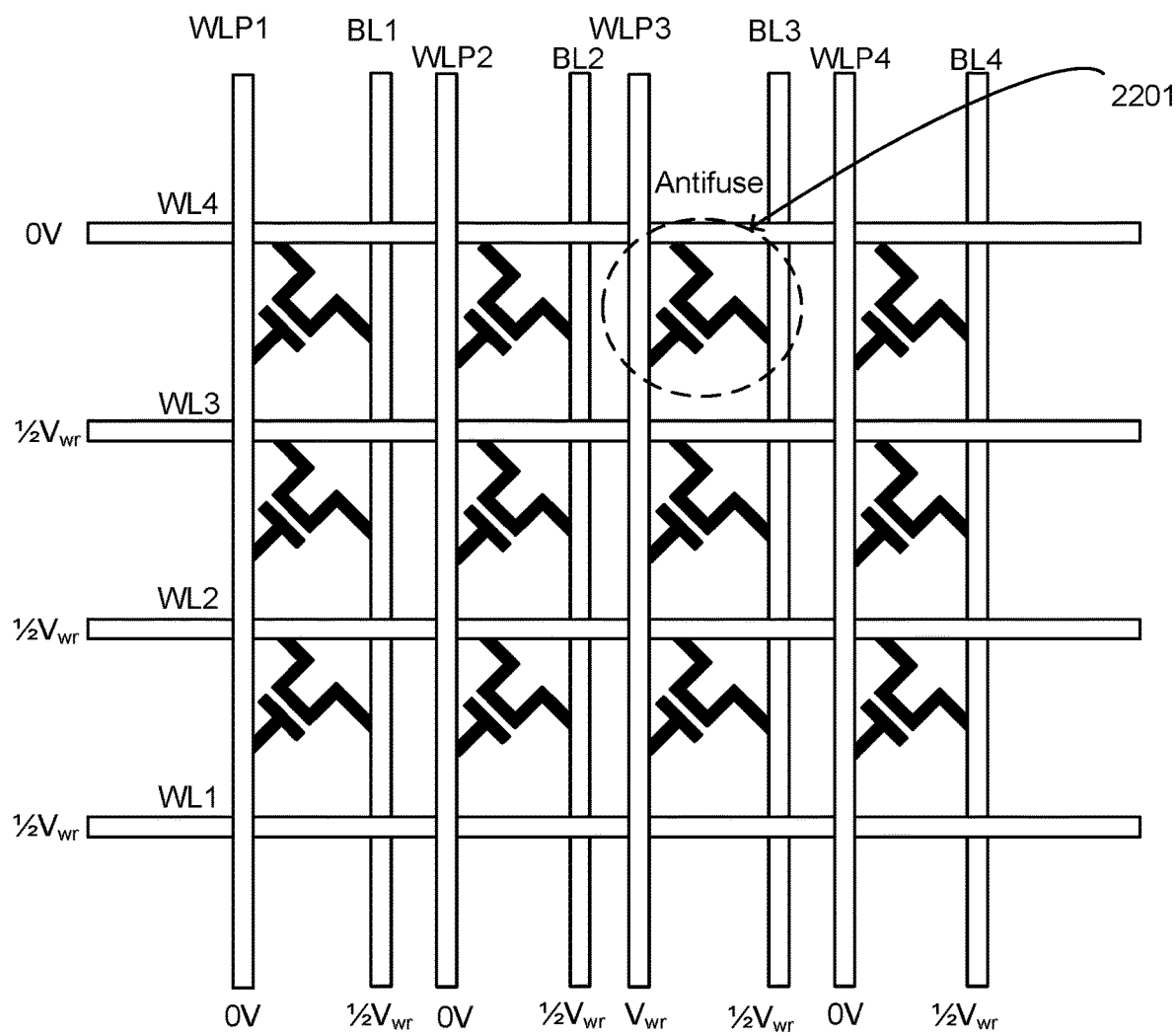
FIG. 22 is a top-view of a portion of a crosspoint array structure incorporating the anti-fuse based memory cell of FIG. 21.

FIG. 22 is a top-view of a portion of a crosspoint array structure incorporating the anti-fuse based memory cell of FIG. 21. FIG. 22 is similar to the view FIG. 12C or 17, but represents an anti-fuse memory cell at each crosspoint and now also includes the programming lines WLP1-WLP4. For example, the memory cell 2201 is connected between word line WL4 and bit line BL3 and has its control gate connected to WLP 3. Although not shown in order to simplify the figure, a resistance can be connected in series with each of the anti-fuse memory cells to increase the low resistance state's value.

FIG. 22 illustrates the shown portion of the crosspoint array biased to program the memory cell 2201 in one embodiment, where electrical selection is done using a half-select scheme combined with a programming voltage $V_{wr}$ applied to the programming word line program. To write a selected weight value to anti-fuse 2201, the corresponding programming word line WLP3 is set to $V_{wr}$, with the corresponding word line WL4 is set to 0V and corresponding bit line BL3 is set to $\frac{1}{2}V_{wr}$. The bit lines of the unselected bit lines are also set to $\frac{1}{2}V_{wr}$, as are the unselected word lines. The programming word line for the unselected memory cells are set to 0V, where programming can be performed sequentially, programming word line by programming word line, similarly described above with respect to FIG. 17 but where the sequence is now for the programming word lines, rather that bit lines (that now stay half selected for both selected and unselected memory cells). Unselected anti-fuse cells which share the programming word line with the program selected anti-fuse memory cell (WLP3 in this example) do not experience oxide breakdown, as the gate-source or gate-drain voltages remain at to $\frac{1}{2}V_{wr}$. Once the array is programmed, the program word lines are no longer required for read operations, which are performed similarly to describe above with respect to the thin dielectric layer based memory cells.

Figure 23:
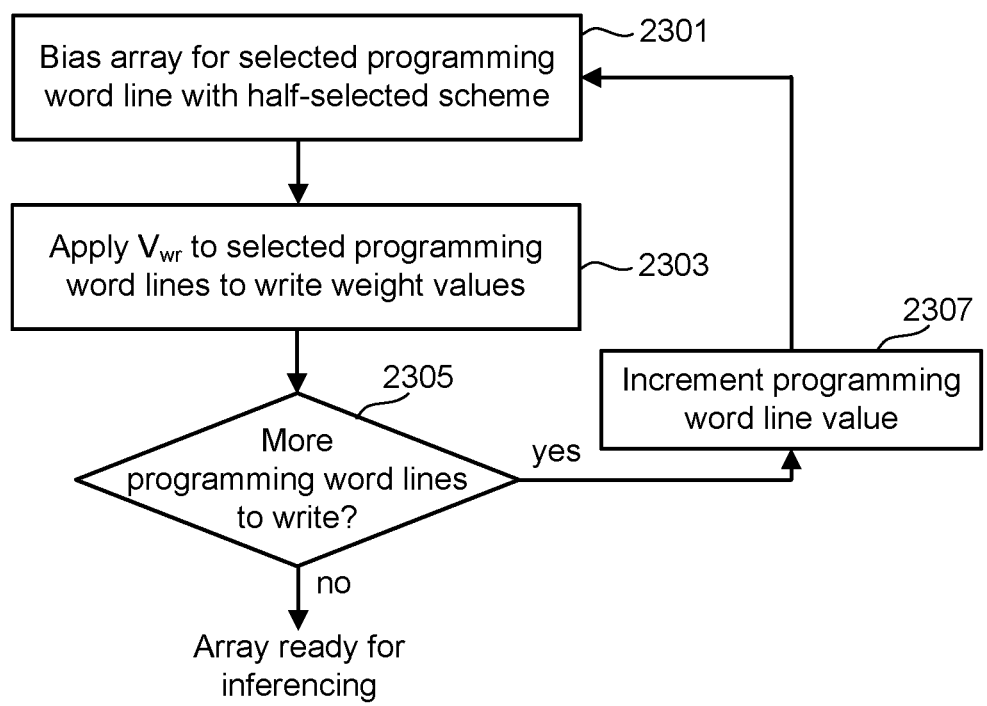
FIG. 23 is a flowchart illustrating an embodiment for the programming of a crosspoint architecture using memory cells with FET based anti-fuses for an inference engine.

FIG. 23 is a flowchart illustrating an embodiment for the programming of a crosspoint architecture using memory cells with FET based anti-fuses for an inference engine. The flow of FIG. 23 includes an embodiment of a method for programming the crosspoint memory array (steps 2301-2307) and the subsequent use of the memory array for inferencing can be as described above with respect to steps 2011-2019 of FIG. 20. Although the description here is in the context of an inference engine for a neural network as the described structures and techniques can be of particular utility in such applications, they can be more generally applied as low power non-volatile memory with high retention can used in many contexts.

At step 2301 the array is biased for a selected programming word line, where the programming sequence can start with WLP0, similarly to the sequence illustrated with respect to FIG. 17 for bit lines, but now for programing word lines. For example, all of the bit lines and unselected word lines can be half-selected and biased at $\frac{1}{2}V_{wr}$, and the word lines corresponding to selected memory cells can be biased to ground. At step 2303 the programming voltage $V_{wr}$ is applied to the selected programming word line. The biasing of the word lines, programming word lines, and bit lines at steps 2301 and 2303 can be performed by one or more control circuits including the biasing circuitry within the row decoder 324 and the column decoder 332 and read/write circuits 328.

The process of steps 2301 and 2303 is repeated for each programming word line. At step 2305 it is determined whether there are more programming bit lines to write and, if so, the bit line is incremented at step 2307 before looping back to step 2301; and, if not, the programming of the memory array is complete. Once the memory array is programmed with weights of a neural network, it can be used as an inferencing engine as described above with respect to steps 2011-2019 of FIG. 20.

As with the embodiments above, in applications as an inference engine the programming of an array would typically done prior to being provided to the end user. For example, the memory array can be programmed by the manufacturer prior to shipping, such as at the end of the testing processes that are commonly performed on fresh devices. Alternately, the memory array could be programmed by an intermediate party before supplied to the end user: for example, the unprogrammed memory array (either initialized or not) could be provided to an original equipment manufacturer (OEM), who could then program their data (such as weights for a DNN model), and then supply a product that incorporates the programmed array to the OEM's customer. This would be the case of, for example, an autonomous vehicle that relied upon neural networks and the manufacturer would program the weights of their neural network models into the arrays before the vehicle is provided to the end operator.

As the memory array will typically only be programmed once prior to being supplied to the end user, in some embodiments the programming voltages $V_{wr}$ may not be generated on the memory device itself, but externally supplied during programming. In this case, the one or more control circuits on the memory device, such as power control 316, do not need to have the capability to generate the $V_{wr}$ and can avoid circuit elements such charge pumps and circuitry to handle the higher voltages, saving on area and power consumption for these circuits.

According to a first set of aspects, an apparatus includes a control circuit configured to connect to a plurality of multi-level memory cells connected along one or more bit lines and each memory cell formed of a plurality of dielectric layers separated by conductive layers. The control circuit is configured to: individually program write selected memory cells to one of a plurality of data states by applying one of a corresponding plurality of write voltage to break down one or more of the dielectric layers of the write selected memory cells; and concurrently sense a first plurality of the memory cells connected along a first bit line in response to a set of corresponding first plurality of input voltages applied to the first plurality of memory cells.

In additional aspects, a method includes biasing an array of memory cells for concurrently programming one or more first selected memory cells to a first one of a plurality of data state, the array formed according to a crosspoint architecture in which of the memory cells are connected between a corresponding bit line and a corresponding word line and each of the memory cells formed of a plurality of dielectric layers separated by conductive layers. The biasing includes: setting a bit line of the array corresponding to the one or more first selected memory cells to a low voltage value; setting bit lines of the array not corresponding to the one or more first selected memory cells to a first intermediate voltage level; and setting word lines of the array not corresponding to the one or more first selected memory cells to the first intermediate voltage level. While biasing the array of memory cells for concurrently programming one or more first selected memory cells to the first one of the plurality of data state, a first write voltage is applied to word lines of the array corresponding to the one or more first selected memory cells, the first write voltage selected to break down one or more of the dielectric layers of the first selected memory cells to program the first selected memory cells to the first one of the plurality of data states, where the first intermediate voltage level is intermediate to the low voltage value and the first write voltage.

In another set of aspects, a non-volatile memory device includes a memory array and one or more control circuits connected to the memory array. The memory array includes: a plurality of word lines; a plurality of bit lines; a plurality of programming lines; and a plurality of anti-fuse memory cells. The memory array has a crosspoint architecture, each anti-fuse memory cell including a field effect transistor (FET) connected between a corresponding one of the bit lines and a corresponding one of the word lines and having a control gate connected to a corresponding one of the programming lines. Each of the anti-fuse memory cells is programmable from a high resistance state to a low resistance state by breaking down of a gate oxide of the memory cell. The one or more control circuits are configured to: program selected ones of the anti-fuse memory cells by biasing the corresponding word line and corresponding bit line to place a voltage differential across the selected memory cells while applying a write voltage to the corresponding programming line to break down the gate oxide of the selected memory cell; and concurrently sense a first plurality of the memory cells connected along a shared bit line in response to a set of corresponding first plurality of input voltages applied to the corresponding plurality of word lines while setting the programming lines to ground.

For purposes of this document, reference in the specification to "an embodiment," "one embodiment," "some embodiments," or "another embodiment" may be used to describe different embodiments or the same embodiment.

For purposes of this document, a connection may be a direct connection or an indirect connection (e.g., via one or more other parts). In some cases, when an element is referred to as being connected or coupled to another element, the element may be directly connected to the other element or indirectly connected to the other element via intervening elements. When an element is referred to as being directly connected to another element, then there are no intervening elements between the element and the other element. Two devices are "in communication" if they are directly or indirectly connected so that they can communicate electronic signals between them.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

The foregoing detailed description has been presented for purposes of illustration and description. It is not intended to be exhaustive or to limit to the precise form disclosed. Many modifications and variations are possible in light of the above teaching. The described embodiments were chosen in order to best explain the principles of the proposed technology and its practical application, to thereby enable others skilled in the art to best utilize it in various embodiments and with various modifications as are suited to the particular use contemplated. It is intended that the scope be defined by the claims appended hereto.

What is claimed is:

1. An apparatus, comprising:
   a control circuit configured to connect to a plurality of multi-level memory cells connected along one or more bit lines and each memory cell formed of a plurality of dielectric layers separated by conductive layers, the control circuit is configured to:
   individually program write selected memory cells to one of a plurality of data states by applying a selected one of a plurality of write voltages to break down a corresponding one or more of the plurality of dielectric layers of the write selected memory cells; and
   concurrently sense a first plurality of the memory cells connected along a first bit line in response to a set of corresponding first plurality of input voltages applied to the first plurality of memory cells.

2. The apparatus of claim 1, wherein the control circuit comprises:
   an analog to digital converter configured to receive a value of a current in the first bit line in response to the set of corresponding first plurality of input voltages applied to the first plurality of memory cells and determine a multi-bit output value from the current.

3. The apparatus of claim 1, wherein the control circuit is formed on a control die, the apparatus further comprising:
   a memory die including the memory cells, the memory die formed separately from and bonded to the control die.

4. The apparatus of claim 3, wherein memory die includes an array of memory cells comprising:
   the memory cells;
   a plurality of bit lines, including the first bit line; and
   a plurality of word lines, the array formed according to a crosspoint architecture in which each of the memory cells is connected between a corresponding one of the bit lines and a corresponding one of the word lines.

5. The apparatus of claim 4, wherein each of the memory cells comprises:
   a plurality of dielectric layers, each of the dielectric layers formed to have a one of a plurality of different effective breakdown voltages and to have a one of a plurality of different resistance values such that the higher the resistance value of the dielectric layer the lower the effective breakdown voltage of the dielectric layer; and
   one or more conductive layers, the conductive layers alternating with the dielectric layers.

6. The apparatus of claim 4, wherein each of the memory cells comprises:
   a plurality of tiers, each of the tiers having one or more dielectric layers, each of the dielectric layers formed to have a common effective breakdown voltage and to have a one of a plurality of resistance values, the dielectric layers of the same tier formed to have the same resistance value and the dielectric layers of different tiers formed to have different resistance values, and such that the larger the number of layers in the tier the lower the resistance value of the dielectric layers of the tier; and
a plurality of conductive layers, the conductive layers alternating with the dielectric layers.

7. The apparatus of claim 4, wherein, to program one or more write selected memory cells along a selected bit line to a first data state, the control circuit is configured to concurrently:
bias the selected bit line to a low voltage level;
bias the word lines corresponding to the write selected memory cells to the write voltage corresponding to the first data state; and
bias word lines not corresponding to the write selected memory cells and bit lines other than the selected bit to a voltage level intermediate to the low voltage level and the write voltage corresponding to the first data state.

8. The apparatus of claim 4, wherein the control circuit comprises:
one or more analog to digital converters connected to the bit lines and configured to receive a value of a current in each of the bit lines in response to the set of corresponding input voltages applied to the word lines and determine a multi-bit output value from each of the currents.

9. The apparatus of claim 8, wherein the control circuit comprises:
a digital computation circuit connected to the one or more analog to digital converters and configured to accumulate the multi-bit output values.

10. The apparatus of claim 9, wherein the memory cells are configured to store weights of a layer of a neural network, and wherein the control circuit is further configured to:
receive a vector input values for the layer of the neural network, the vector of input values having a plurality of components;
convert the components of the input vector into a set of voltage levels; and
apply each of the set of voltage levels to a corresponding set of the word lines.

11. The apparatus of claim 10, wherein the control circuit is further configured to:
concurrently accumulate the multi-bit output from a plurality of the bit lines in response to applying each of the set of voltage levels to the corresponding set of the word lines.

12. The apparatus of claim 1, wherein control circuit is further configured to:
receive a plurality of weight values for a layer of a neural network;
program the weight values into the memory cells as data states;
receive, subsequent to programming the weight values into the memory cells, an input vector for the layer of the neural network;
convert the input vector into the first plurality of input voltages; and
perform an in-array multiplication of the input vector with the weight values by applying the first plurality of input voltages to the memory cells.

13. A method, comprising:
biasing an array of memory cells for concurrently programming one or more first selected memory cells to a first one of a plurality of data state, the array formed according to a crosspoint architecture in which of the memory cells are connected between a corresponding bit line and a corresponding bit line and each of the memory cells formed of a plurality of dielectric layers separated by conductive layers, the biasing comprising:
setting a bit line of the array corresponding to the one or more first selected memory cells to a low voltage value;
setting bit lines of the array not corresponding to the one or more first selected memory cells to a first intermediate voltage level; and
setting word lines of the array not corresponding to the one or more first selected memory cells to the first intermediate voltage level; and
while biasing the array of memory cells for concurrently programming one or more first selected memory cells to the first one of the plurality of data state, applying a first write voltage to word lines of the array corresponding to the one or more first selected memory cells, the first write voltage selected to break down one or more of the dielectric layers of the first selected memory cells to program the first selected memory cells to the first one of the plurality of data states, where the first intermediate voltage level is intermediate to the low voltage value and the first write voltage.

14. The method of claim 13, further comprising:
subsequent to biasing the array of memory cells for concurrently programming the first selected memory cells, biasing the array for concurrently programming one or more second selected memory cells connected to the bit line of the array corresponding to the first selected memory cells to a second one of a plurality of data state, the biasing the array for concurrently programming one or more second selected memory cells comprising:
setting a bit line of the array corresponding to the one or more first selected memory cells to a low voltage value;
setting bit lines of the array not corresponding to the one or more second selected memory cells to a second intermediate voltage level; and
setting word lines of the array not corresponding to the one or more second selected memory cells to the second intermediate voltage level; and
while biasing the array of memory cells for concurrently programming one or more second selected memory cells to the second one of the plurality of data state, applying a second write voltage to word lines of the array corresponding to the second selected memory cells, the second write voltage selected to break down one or more of the dielectric layers of the second selected memory cells to program the second selected memory cells to the second one of the plurality of data states, where the second intermediate voltage level is intermediate to the low voltage value and the second write voltage.

15. The method of claim 13, wherein the memory cells of the array are programmed to store weights of a layer of a neural network and the method further comprises:
receiving an input vector for the layer of the neural network; and
performing an in-array multiplication of the input vector with the weights of the neural network by:
converting an input vector into a set of voltage levels; and
applying the set of voltage levels to the word lines of the array.

16. A non-volatile memory device, comprising:
a memory array, comprising:

a plurality of word lines;
a plurality of bit lines;
a plurality of programming lines; and
a plurality of anti-fuse memory cells, the memory array having a crosspoint architecture, each anti-fuse memory cell including a field effect transistor (FET) connected between a corresponding one of the bit lines and a corresponding one of the word lines and having a control gate connected to a corresponding one of the programming lines, each of the anti-fuse memory cells programmable from a high resistance state to a low resistance state by breaking down of a gate oxide of the memory cell; and one or more control circuits connected to the memory array and configured to:
program selected ones of the anti-fuse memory cells by biasing the corresponding word line and corresponding bit line to place a voltage differential across the selected memory cells while applying a write voltage to the corresponding programming line to break down the gate oxide of the selected memory cell; and
concurrently sense a first plurality of the memory cells connected along a shared bit line in response to a set of corresponding first plurality of input voltages applied to the corresponding plurality of word lines while setting the programming lines to ground.

17. The non-volatile memory device of claim 16, wherein the non-volatile memory device comprises:
a bonded die pair, comprising:
a memory die including the memory array; and
a control die, formed separately from and bonded to the memory die and including the one or more control circuits.

18. The non-volatile memory device of claim 16, wherein each anti-fuse memory cell further includes a resistor connected in series with the field effect transistor between the corresponding bit line and the corresponding word line.

19. The non-volatile memory device of claim 16, wherein, to program selected ones of the anti-fuse memory cells, the one or more control circuits are configured to concurrently:
bias a programming line corresponding to one or more selected memory cells to a write select voltage and biasing other programming lines of the array to a low voltage value;
bias word lines corresponding to selected memory cells to the low voltage value and biasing other word lines of the array to a voltage level intermediate to the write select voltage and the low voltage value; and
biasing the bit lines of the array to the voltage level intermediate to the write select voltage and the low voltage value.

20. The non-volatile memory device of claim 16, wherein the memory cells are configured to store weights of a layer of a neural network, and wherein the one or more control circuit are further configured to:
receive a vector of input values for the layer of the neural network; and
perform an in-array multiplication operation for neural network by converting the vector of input values into set of voltage levels and concurrently applying the set of voltage levels to a corresponding set of the word lines.

* * * * *